(12) United States Patent
Chang

(10) Patent No.: US 9,607,702 B2
(45) Date of Patent: Mar. 28, 2017

(54) SUB-BLOCK PAGE ERASE IN 3D P-CHANNEL FLASH MEMORY

(71) Applicant: Macronix International Co., Ltd., Hsinchu (TW)

(72) Inventor: Kuo-Pin Chang, Miaoli (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/668,728

(22) Filed: Mar. 25, 2015

(65) Prior Publication Data
US 2016/0284413 A1    Sep. 29, 2016

(51) Int. Cl.
G11C 16/14    (2006.01)
G11C 16/04    (2006.01)

(52) U.S. Cl.
CPC .......... *G11C 16/14* (2013.01); *G11C 16/0483* (2013.01)

(58) Field of Classification Search
CPC ............................ G11C 16/14; G11C 16/0483
USPC ..................................... 365/185.18
See application file for complete search history.

(56) References Cited

U.S. PATENT DOCUMENTS

| | | |
|---|---|---|
| 6,906,940 B1 | 6/2005 | Lue |
| 7,315,474 B2 | 1/2008 | Lue |
| 7,420,242 B2 | 9/2008 | Lung |
| 7,696,559 B2 | 4/2010 | Arai et al. |
| 7,851,849 B2 | 12/2010 | Kiyotoshi |
| 8,278,170 B2 | 10/2012 | Lee et al. |
| 8,363,476 B2 | 1/2013 | Lue et al. |
| 8,467,219 B2 | 6/2013 | Lue |
| 8,503,213 B2 | 8/2013 | Chen et al. |
| 8,513,725 B2 | 8/2013 | Sakuma et al. |
| 8,759,899 B1 | 6/2014 | Lue et al. |
| 8,976,600 B2 | 3/2015 | Hung et al. |

(Continued)

FOREIGN PATENT DOCUMENTS

EP    2048709 A2    4/2009

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, pp. 91-92.

(Continued)

*Primary Examiner* — Richard Elms
*Assistant Examiner* — Jerome Leboeuf
(74) *Attorney, Agent, or Firm* — Yiding Wu; Haynes Beffel & Wolfeld LLP

(57) ABSTRACT

A NAND array includes blocks of memory cells. A block of memory cells includes a plurality of strings having channel lines between first and second string select switches. The strings share a set of word lines between the first and second string select switches. A channel-side voltage can be applied to the channel lines. A control voltage can be applied to a selected subset of the first string select switches. The channel lines can be floated at ends of the second string select switches. Tunneling in memory cells coupled to an unselected subset of the first string select switches can be inhibited. Word line-side erase voltages can be applied to word lines in the set of word lines in the block to induce tunneling in memory cells coupled to the word lines and coupled to the selected subset of the first string select switches.

19 Claims, 11 Drawing Sheets

(56) References Cited

U.S. PATENT DOCUMENTS

| | | | |
|---|---|---|---|
| 9,036,428 B1* | 5/2015 | D'Abreu | G11C 16/16 365/185.23 |
| 2005/0280061 A1 | 12/2005 | Lee | |
| 2007/0045708 A1 | 3/2007 | Lung | |
| 2007/0252201 A1 | 11/2007 | Kito et al. | |
| 2008/0073635 A1 | 3/2008 | Kiyotoshi et al. | |
| 2008/0175032 A1 | 7/2008 | Tanaka et al. | |
| 2008/0180994 A1 | 7/2008 | Katsumata et al. | |
| 2009/0097321 A1 | 4/2009 | Kim et al. | |
| 2009/0184360 A1 | 7/2009 | Jin et al. | |
| 2010/0270593 A1 | 10/2010 | Lung et al. | |
| 2011/0305088 A1 | 12/2011 | Huang et al. | |
| 2012/0119283 A1 | 5/2012 | Lee et al. | |
| 2012/0182806 A1 | 7/2012 | Chen et al. | |
| 2012/0236642 A1* | 9/2012 | Lue | H01L 27/0688 365/185.05 |
| 2013/0279251 A1 | 10/2013 | Lee | |
| 2014/0036590 A1* | 2/2014 | Feeley | G11C 16/0483 365/185.11 |
| 2014/0133238 A1* | 5/2014 | Rhie | G11C 16/10 365/185.17 |
| 2014/0192594 A1 | 7/2014 | Lue | |
| 2014/0254284 A1 | 9/2014 | Hung et al. | |
| 2014/0362644 A1 | 12/2014 | Lue et al. | |
| 2015/0170749 A1* | 6/2015 | Park | G11C 16/14 365/185.05 |
| 2015/0206899 A1 | 7/2015 | Chen | |

OTHER PUBLICATIONS

Choi et al., "Performance Breakthrough in NOR Flash Memory with Dopant-Segregated Schottky-Barrier (DSSB) SONOS Devices", 2009 Symposium on VLSI Technology Digest of Technical Papers, p. 222-223.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nm Node," IEEE IEDM Dec. 11-13, 2006, 4 pages.

Katsumata, et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Komori et al. "Disturbless flash memory due to high boost efficiency on BiCS structure and optimal memory film stack for ultra high density storage device," IEEE Electron Devices Meeting, Dec. 15-17, 2008, 4 pages.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Nowak et al., "Intrinsic fluctuations in Vertical NAND flash memories," 2012 Symposium on VLSI Technology, Digest of Technical Papers, pp. 21-22, Jun. 12-14, 2012.

Tanaka H., et al., "Bit Cost Scalable Technology with Punch and Plug Process for Ultra High Density Flash Memory," 2007 Symp. VLSI Tech., Digest of Tech. Papers, pp. 14-15.

U.S. Appl. No. 14/284,306, filed May 21, 2014 by Hang-Ting Lue, 60 pages.

U.S. Appl. No. 14/582,963, filed Dec 24, 2014 by Shih-Hung Chen, 35 pages.

U.S. Appl. No. 14/608,053 entitled "Source Line Formation in 3D Vertical Channel and Memory ," filed Jan. 28, 2015, 59 pages.

U.S. Appl. No. 14/637,204 entitled "U-Shaped Vertical Thin-Channel Memory," filed Mar. 3, 2015, 78 pages.

U.S. Appl. No. 14/643,907 entitled "Forced-Bias Method in Sub-Block Erase ," filed Mar. 10, 2015, 46 pages.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

* cited by examiner

SUB-BLOCK PAGE ERASE IN 3D P-CHANNEL FLASH MEMORY

BACKGROUND

Field of the Technology

The present technology relates to high density memory devices, and particularly the operation of devices using stacked memory structures.

Description of Related Art

As critical dimensions of devices in integrated circuits shrink toward perceived limits of manufacturing technologies, designers have been looking to techniques to achieve greater storage capacity, and to achieve lower costs per bit. Technologies being pursued include multiple layers of memory cells on a single chip. Operations performed on a 3D NAND memory having multiple layers of memory cells include read, write and erase.

Typically, erase operations are performed by blocks of memory cells, where each block includes stacks of layers of memory cells. A general issue of 3D NAND memories is that the size of a block of memory cells is often very large. This is not convenient if a user wants only to change the code of a small unit stored in a 3D NAND memory. As the density of 3D NAND memories increases, the number of layers in the stacks increase, leading to larger block sizes and further inconvenience in erase operations.

Thus, it is desirable to provide for a technology with more efficient and convenient erase operations in 3D NAND memories.

SUMMARY

A method is provided for page erase in an NAND array, where a page can be defined, for the purpose of this description, as including the memory cells in one stack of channel lines, selected by a single SSL switch, where each channel line is coupled to a corresponding bit line via the stairstep pads. The term "block" as used herein is a set of NAND strings operated simultaneously during an erase operation, and in which all the NAND strings are connected to a reference voltage during the erase operation, usually via a line called a common source line in response to a shared control signal usually called a ground select signal on a ground select line GSL, even though the reference line may be coupled to potentials other than ground. Also, all the NAND strings in a block are connected to a shared set of word lines. The bit lines in a block can be connected to the NAND strings individually in response to a control signal usually called a string select signal on a set of string select lines SSLs. In a block erase operation, all the string select signals for a selected block are operated simultaneously to cause erase of the complete block. Also, blocks are often configured on an integrated circuit so that they can be electrically isolated from adjacent blocks for the purposes of a block erase operation, such as by being separated from one another by insulating structures.

A method of operating a NAND array is provided for page erase operations. The NAND array includes a plurality of blocks of memory cells, wherein a block of memory cells in the plurality of blocks includes a plurality of NAND strings having channel lines between first string select switches (SSL) and second string select switches (GSL), and in which the plurality of NAND strings shares a set of word lines between the first and second string select switches.

A channel-side voltage can be applied to the channel lines through the first string select switches in a selected block. A control voltage lower than the channel-side voltage can be applied to a selected subset of the first string select switches. The channel lines can be floated at ends of the second string select switches. Tunneling in memory cells coupled to an unselected subset of the first string select switches can be inhibited.

The floating step can include applying the channel-side voltage to the channel lines through the second string select switches, and to the second string select switches. The inhibiting step can include applying the channel-side voltage to the unselected subset of the first string select switches when applying the channel-side voltage to the channel lines coupled to the unselected subset.

In one implementation, word line-side erase voltages can be applied to the set of word lines in the selected block to induce tunneling in memory cells coupled to the set of word lines and coupled to the selected subset of the first string select switches.

In an alternative implementation, word line-side erase voltages can be applied to a selected subset of the set of word lines in the selected block to induce tunneling in memory cells coupled to the selected subset of the set of word lines and coupled to the selected subset of the first string select switches. A number of word lines can be logically selected for the selected subset of the set of word lines. Word line-side inhibit voltages can be applied to an unselected subset of the set of word lines to inhibit tunneling in memory cells coupled to the unselected subset of the set of word lines and coupled to the unselected subset of the first string select switches.

The method described herein can be executed in response to a command to erase memory cells coupled to a selected subset of the first string select switches (SSL) in a selected block. Alternatively, the method described herein can be executed in response to a command to erase memory cells coupled to a selected subset of the set of word lines, and coupled to a selected subset of the first string select switches (SSL) in a selected block.

Other aspects and advantages of the present technology can be seen on review of the drawings, the detailed description and the claims, which follow.

DETAILED DESCRIPTION

Figure 1:
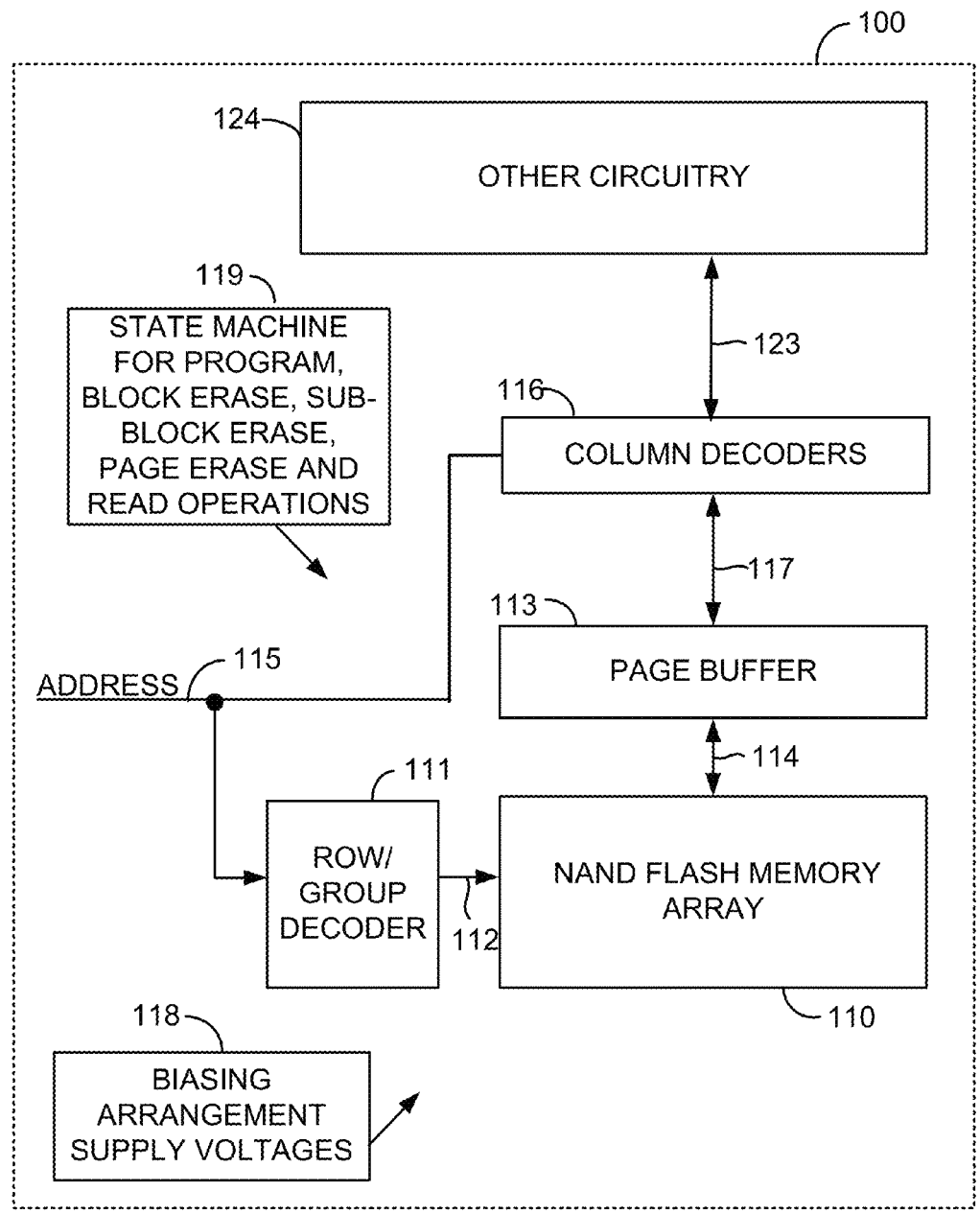
FIG. 1 is a simplified block diagram of an integrated circuit memory employing memory cells and bias circuitry according to embodiments of the present technology.

A detailed description of embodiments of the present technology is provided with reference to the Figures. It is to be understood that there is no intention to limit the technology to the specifically disclosed structural embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 is a simplified block diagram of an integrated circuit 100 including a NAND flash memory array 110 which can be operated as described herein. In some embodiments, the array 110 is a 3D memory and includes multiple layers of cells. The array can include a plurality of blocks of memory cells, where a block of memory cells can include a plurality of NAND strings having channel lines between first string select switches (e.g. SSL) and second string select switches (e.g. GSL). The plurality of NAND strings shares a set of word lines between the first and second string select switches.

A row decoder 111 is coupled to a plurality of word lines 112 arranged along rows in the memory array 110. The row decoder can include a set of local word line drivers that drive respective word lines in the set of word lines in a selected block of memory cells. The set of local word line drivers can include a first subset of the set of local word line drivers driving a first subset of the set of word lines, and a second subset of the set of local word line drivers driving a second subset of the set of word lines.

The memory can include a set of global word lines, including first global word lines connected to the first subset of the set of local word line drivers. In one implementation, the first global word lines are also connected to the second subset of the set of local word line drivers, and the memory can include a global word line driver driving the first global word lines. In an alternative implementation, the set of global word lines can include second global word lines connected to the second subset of the set of local word line drivers, and the memory can include a first global word line driver driving the first global word lines, and a second global word line driver driving the second global word lines.

Column decoders in block 116 are coupled to a set of page buffers 113, in this example via data bus 117. The global bit lines 114 are coupled to the set of page buffers 113 and to channel lines (not shown) arranged along columns in the memory array 110. Addresses are supplied on bus 115 to column decoder (block 116) and row decoder (block 111).

Data is supplied via the data-in line 123 from other circuitry 124, including for example input/output ports, on the integrated circuit, such as a general purpose processor or special purpose application circuitry, or a combination of modules providing system-on-a-chip functionality supported by the array 110. Data is supplied via the data-in line 123 to input/output ports or to other data destinations internal or external to the integrated circuit 100.

A controller, implemented in this example as a state machine (e.g. 119), is coupled to the blocks of memory cells, and provides signals to control the application of bias arrangement supply voltages generated or provided through the voltage supply or supplies in block 118 to carry out the various operations described herein on data in the array. These operations include program, block erase, sub-block erase, page erase, and read. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

The controller can include logic to execute page erase operations described herein. For instance, the controller can include logic to bias a page in a block of memory cells for negative Fowler-Nordheim (−FN) tunneling to inject holes into the charge storage structures of cells in the selected page, thereby reducing the threshold voltages, at least in cells of the page that do not already have a low threshold voltage.

The controller can include logic to apply a channel-side voltage (e.g. −3.3V) to the channel lines through the first string select switches in the selected block, logic to apply a control voltage (e.g. −6V) lower than the channel-side voltage to a first subset of the first string select switches, logic to float the channel lines at ends of the second string select switches, and logic to inhibit tunneling in memory cells coupled to a second subset of the first string select switches.

The logic to float the channel lines can include logic to apply the channel-side voltage (e.g. 3.3V) to the channel lines through the second string select switches, and to the second string select switches. The logic to inhibit can include logic to apply the channel-side voltage (e.g. 3.3V) to the second subset of the first string select switches when executing the logic to apply the channel-side voltage to the channel lines through the first string select switches in the selected block.

In one implementation, the controller can include logic to apply a first global word line voltage (−10V) on the first global word lines, and logic to turn on the first and second subsets of the set of local word line drivers, providing word line-side erase voltages to the first and second subsets of the set of word lines in the selected block, to induce tunneling in memory cells coupled to the first and second subsets of the set of word lines and coupled to the first subset of the first string select switches. In an alternative implementation, the controller can include logic to apply a first global word line voltage (−10V) on the first global word lines, and logic to turn on the first subset of the set of local word line drivers, providing word line-side erase voltages to the first subset of the set of word lines in the selected block, to induce tunneling in memory cells coupled to the first subset of the set of word lines and coupled to the first subset of the first string select switches. The controller can include logic to select a number of word lines for the first subset of the set of word lines.

The set of global word lines can include second global word lines connected to the second subset of the set of local word line drivers. The controller can include logic to apply a second global word line voltage on the second global word lines, and logic to turn on the second subset of the set of local word line drivers, providing word line-side inhibit voltages to the second subset of the set of word lines to inhibit tunneling in memory cells coupled to the second subset of the set of word lines and coupled to the second subset of the first string select switches.

The controller can be configured to execute the logic to apply the channel-side voltage, the logic to apply the control voltage to a selected subset of the first string select switches (SSL), the logic to float, and the logic to inhibit, in response to a page erase command to erase memory cells coupled to the first subset of the first string select switches in the selected block. The page erase command can be issued from a source external or internal to the memory. The page erase command can indicate in which page(s) in a selected block and at which word lines in the page(s) that memory cells are to be erased. Pages to be erased can be logically selected. The page erase command can include a parameter indicating in which pages to erase memory cells. Furthermore, a number of word lines for the first subset of the set of word lines can be logically selected. For instance, the page erase command can include a parameter indicating the number of word lines, for erasing memory cells coupled to the first subset of the set of word lines and coupled to the selected subset of the first string select switches (SSL).

For clarity purposes, the term "program" as used herein refers to an operation which increases the threshold voltage of a memory cell. The data stored in a programmed memory cell can be represented as a logical "0" or logical "1." The term "erase" as used herein refers to an operation which decreases the threshold voltage of a memory cell. The data stored in an erased memory cell can be represented as the inverse of the programmed state, as a logical "1" or a logical "0." Also, multibit cells can be programmed to a variety of threshold levels, and erased to a single lowest threshold level. Further, the term "write" as used herein describes an operation which changes the threshold voltage of a memory cell, and is intended to encompass both program and erase, or a combination of program and erase operations.

Figure 2:
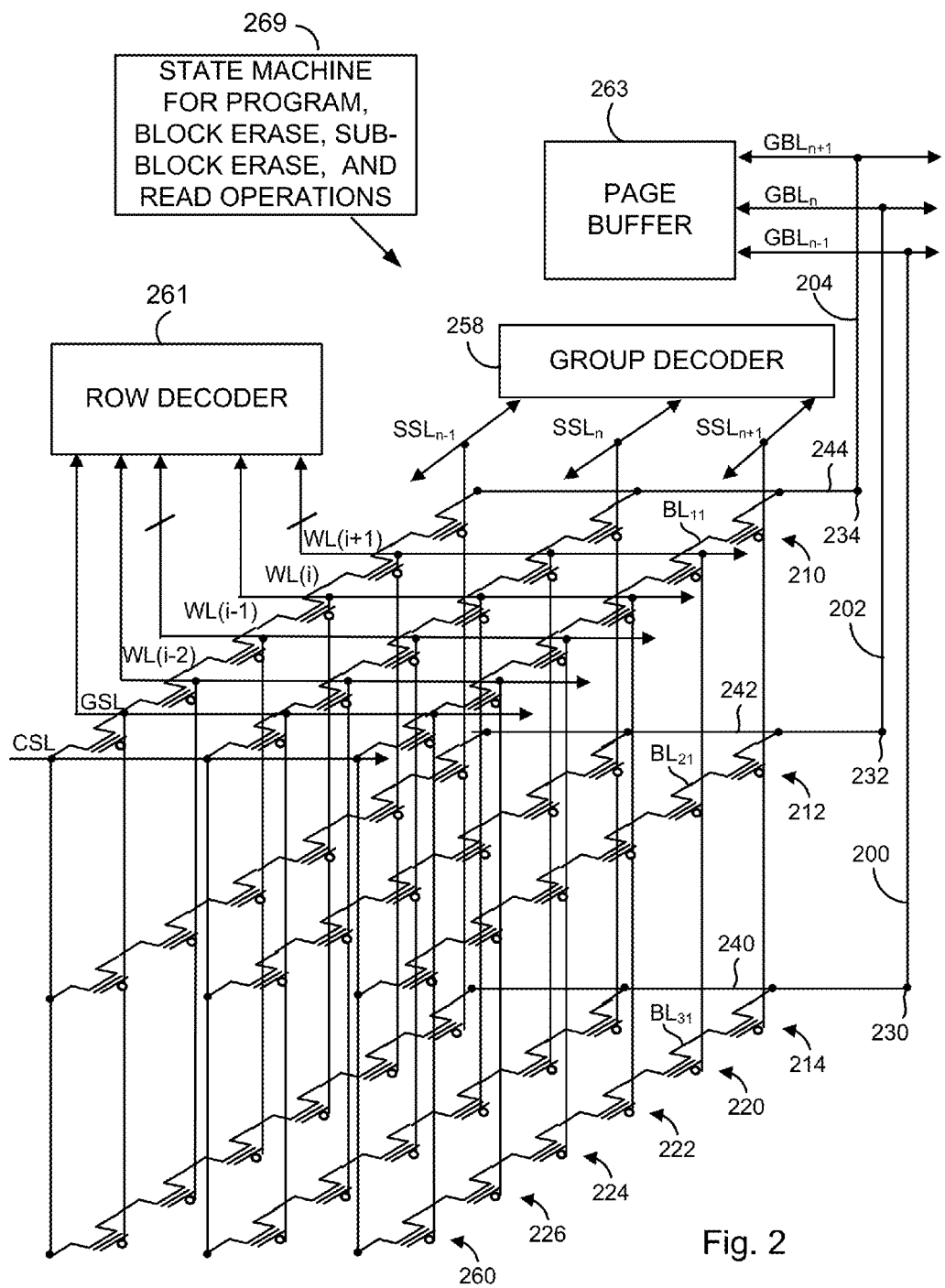
FIG. 2 is a schematic diagram of a portion of the 3D NAND flash memory array usable in a device like that of FIG. 1.

FIG. 2 is a schematic diagram of a portion of the 3D NAND flash memory array usable in a device like that of FIG. 1. In this example, three layers of memory cells are illustrated, which is representative of a block of p-channel memory cells that can include many layers.

In one implementation, a set of word lines in a block of memory cells can have 64 word lines. In another implementation, a set of word lines in a block of memory cells can have more or fewer number of word lines, such as 32 or 128 word lines. As shown in the example of FIG. 2, a set of word lines includes word lines WL0 to WL(i−2), WL(i−1), WL(i), and WL(i+1) to WL63 extend in parallel along a first direction. The word lines WL(i−2), WL(i−1), WL(i), and WL(i+1) are shown in FIG. 2. The set of word lines can include a first subset including word lines WL(i) and a number of word lines adjacent to WL(i) such as WL(i−1) and WL(i+1), and a second subset including some or all of word lines not in the first subset. The second subset can include word lines between the first subset and WL0, and between the first subset and WL63. The first subset of the set of word lines can include more than one member of the set of word lines, and the second subset of the set of word lines can include more than one member of the set of word lines.

Figure 5:
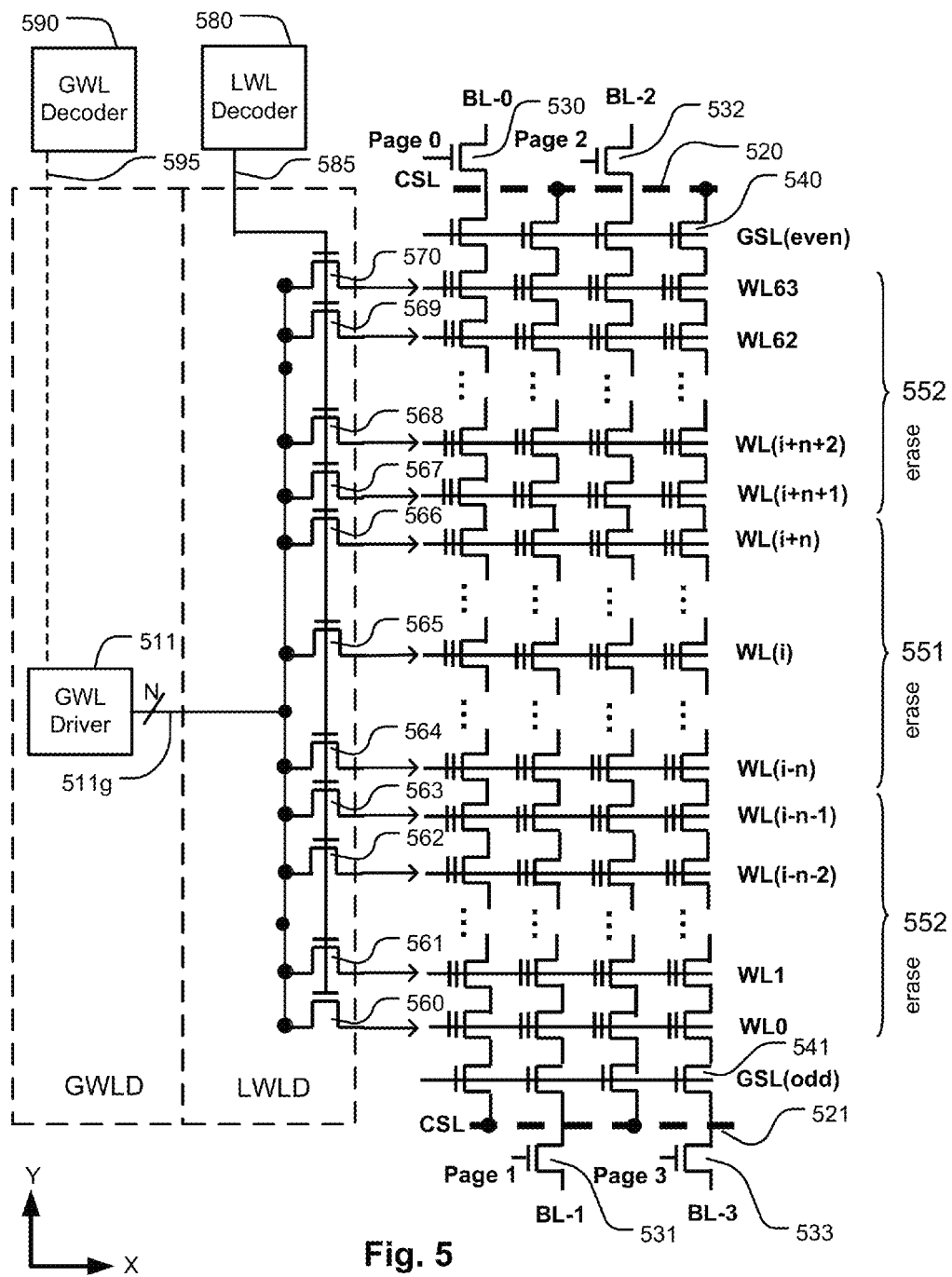
FIG. 5 is a circuit diagram showing example NAND strings in an X-Y plane in a block of memory cells connected to a first configuration of local and global word line drivers in a 3D memory.
Figure 6:
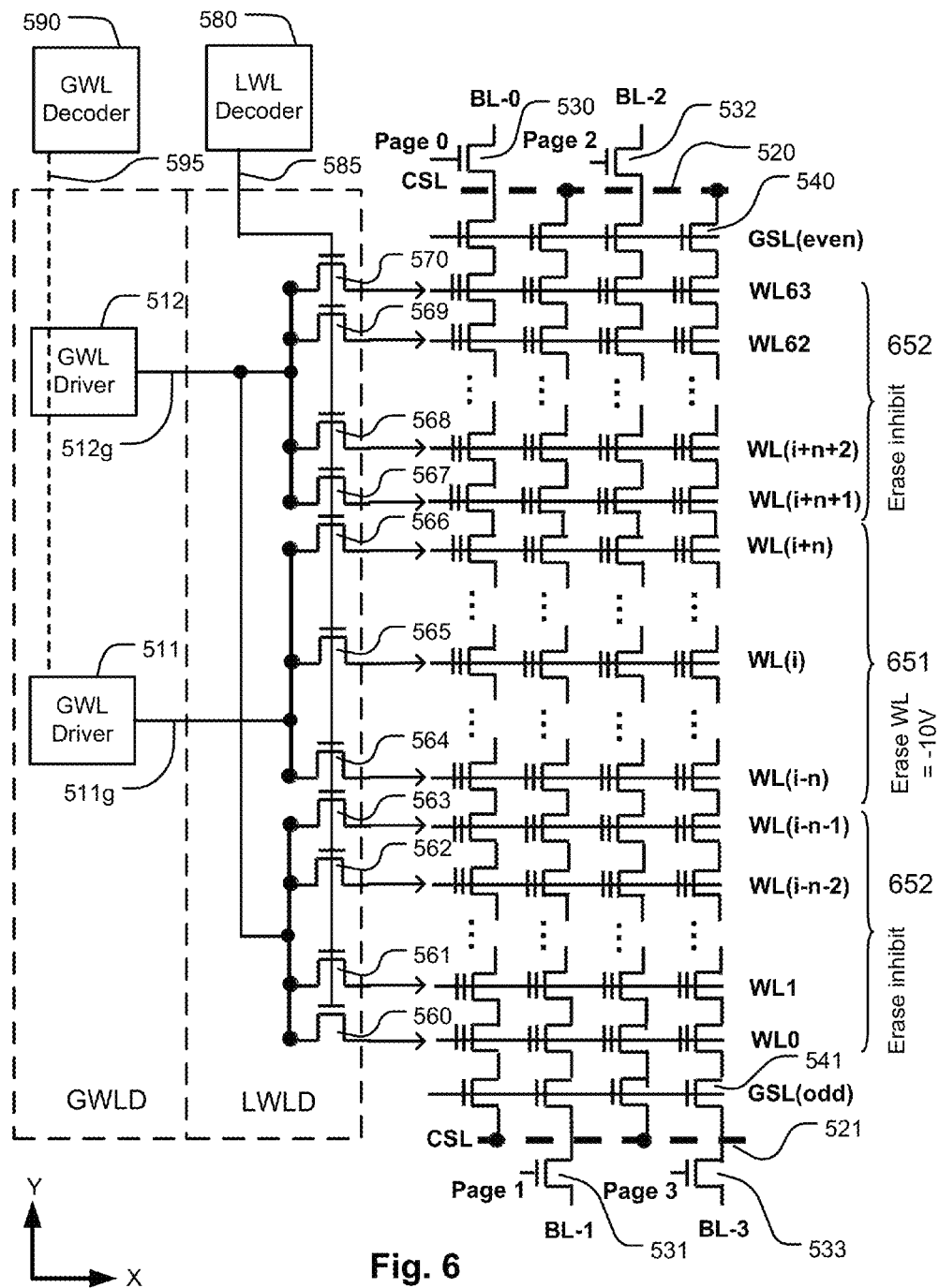
FIG. 6 is a circuit diagram showing example NAND strings in an X-Y plane in a block of memory cells connected to a second configuration of local and global word line drivers in a 3D memory.

The word lines are in electrical communication with row decoder 261, which can include the global word line decoder 590 and local word line decoder 580 as shown in FIGS. 5 and 6. The word lines are connected to the gates of the memory cells, which are arranged in series as a plurality of NAND strings. As shown in FIG. 2, each word line is vertically connected to the gates of the memory cells in each of the various layers underlying the word line.

The plurality of NAND strings has channel lines in the various layers of the memory array. As shown in FIG. 2, the array includes a channel line $BL_{31}$ on the third layer, a channel line $BL_{21}$ on the second layer, and a channel line $BL_{11}$ on the first layer. The memory cells have dielectric charge trapping structures between the corresponding word lines and the corresponding channel lines. In this illustration, there are four memory cells, between a first string select switch (SSL) and a second string select switch (GSL), in a NAND string for simplicity. For example, a NAND string formed by channel line $BL_{31}$ on the third layer includes memory cells 220, 222, 224 and 226. In a typical implementation, a NAND string can include 16, 32, 64 or more memory cells, connected to 16, 32, 64 or more word lines respectively.

A plurality of string select lines including string select lines $SSL_{n-1}$, $SSL_n$, $SSL_{n+1}$ are in electrical communication with group decoder 258 (which could be part of the row decoder 261), which selects a group of strings. The string select lines are connected to the gates of first string select switches arranged at the first ends of the memory cell NAND strings. As shown in FIG. 2, each of the string select lines are vertically connected to the gates of a column of the string select switches in each of the various layers. For example, string select line $SSL_{n+1}$ is connected to the gates of string select switches SSL 210, 212, 214 in the three layers.

The channel lines on a particular layer are selectively coupled to an extension on the particular layer by the corresponding string select switches. For example, the channel lines on the third layer are selectively coupled to extension 240 by the corresponding string select switches in that layer. Similarly, the channel lines on the second layer are selectively coupled to extension 242, and channel lines on the first layer are selectively coupled to extension 244.

The extensions on each of the layers include a corresponding contact pad for contact with a vertical connector coupled to a corresponding global bit line. For example, extension 240 in the third layer is coupled to a global bit line $GBL_{n-1}$ via contact pad 230 and vertical connector 200. Extension 242 on the second layer is coupled to a global bit line $GBL_n$ via contact pad 232 and vertical connector 202. Extension 244 on the third layer is coupled to a global bit line $GBL_{n+1}$ via contact pad 234 and vertical connector 204. The contact pads can be implemented using a stairstep pad as described herein (e.g. 302B, FIG. 3).

The global bit lines $GBL_{n-1}$, $GBL_n$, and $GBL_{n+1}$ are coupled to additional blocks (not shown) in the array and extend to page buffer 263.

Ground select switches (sometimes referred to as second string select switches) are arranged at the second ends of the NAND strings. For example, ground select switch 260 is arranged at the second end of the NAND string formed by memory cells 220, 222, 224 and 226. A ground select line GSL is connected to the gates of the ground select switches. The ground select line GSL is in electrical communication with the row decoder 261 to receive bias voltages during operations described herein.

The ground select switches are used to selectively couple second ends of all the NAND strings in the block to a common source line CSL. The common source line CSL receives bias voltages from the bias circuit (e.g. 118, FIG. 1) during operations described herein.

The blocks can be arranged in an array of blocks, including rows of blocks and columns of blocks. Blocks in a row can share the same sets of word lines and ground select lines GSL. Blocks in a column can share the same sets of global bit lines $GBL_{n-1}$, $GBL_n$, and $GBL_{n+1}$. In this manner, a 3D decoding network is established, selected memory cells which are part of a page can be accessed using one word line, and a set of global bit lines $GBL_{n-1}$, $GBL_n$, and $GBL_{n+1}$ and one string select line deliver data from cells selected in each layer in parallel on the set of global bit lines $GBL_{n-1}$, $GBL_n$, and $GBL_{n+1}$.

The array shown in FIG. 2 includes p-channel NAND strings implemented in a horizontal configuration, with all the cells in a given string on the same layer of the array. In alternative 3D arrangements, the NAND strings can be implemented in a vertical configuration. In some embodiments, the NAND strings are junction-free, in which there are no p-type terminals between the cells. P-type terminals can be implemented only on the sides of the SSL transistors (e.g. 210) that are connected to the bit line extensions (e.g. line 244), and on the sides of the GSL switches (e.g. 260) that are connected to the common source line CSL. A state machine 269 is shown that is configured to control the memory array and supporting circuitry to perform program, block erase, sub-block erase, page erase and read operations.

Figure 3:
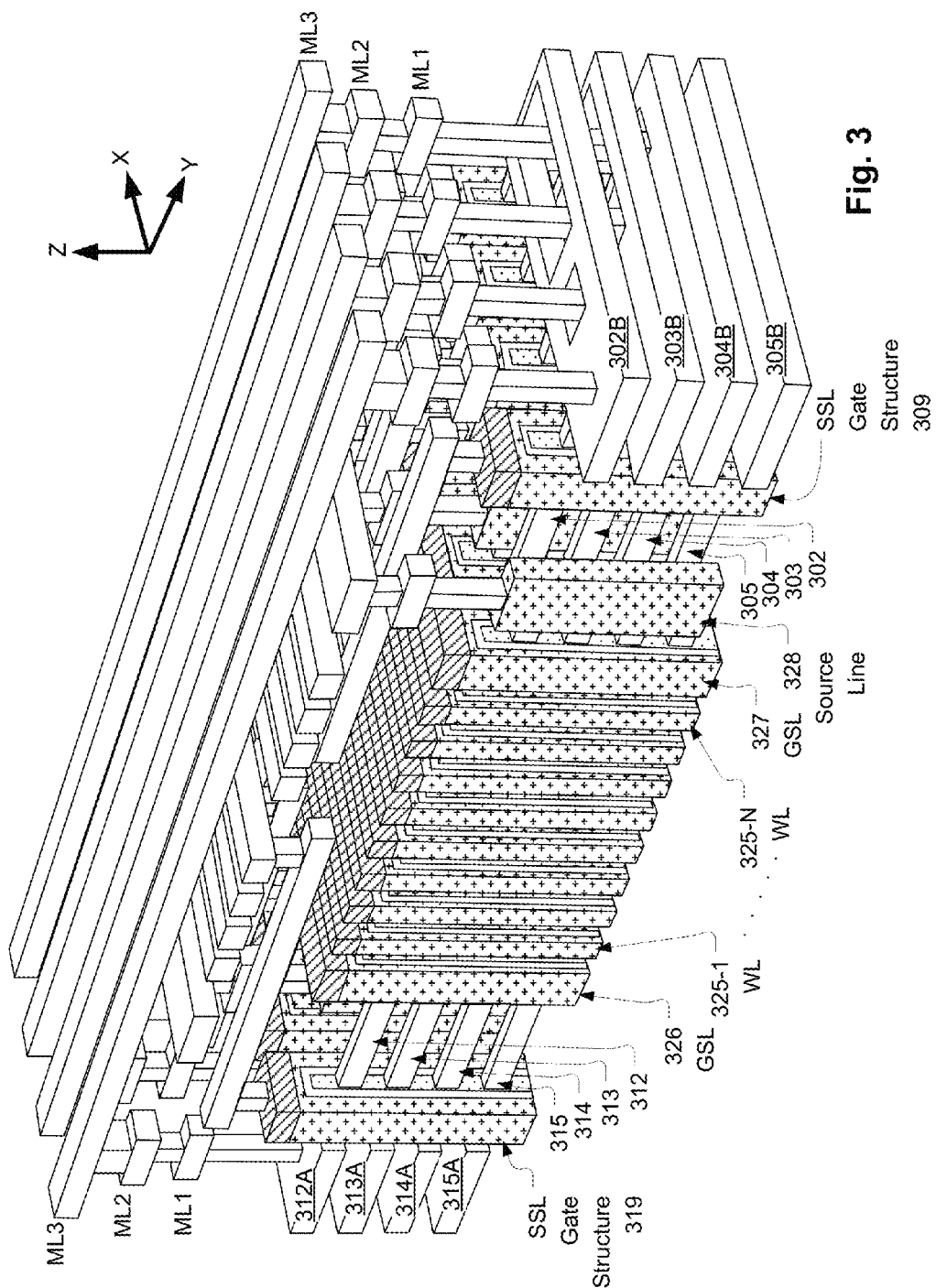
FIG. 3 is a perspective illustration of a 3D unit including even and odd blocks of memory cells including stacks of layers of NAND strings in a 3D vertical gate (3DVG) NAND-flash memory array structure.

FIG. 3 is a perspective illustration of a 3D unit including even and odd blocks of memory cells including stacks of layers of NAND strings in a 3D vertical gate (3DVG) NAND-flash memory array structure. FIG. 3 is a perspective illustration of a 3D unit including even and odd blocks of memory cells including stacks of layers of NAND strings in a 3D vertical gate (3DVG) NAND-flash memory array structure. The 3D NAND-flash memory array structure is described in commonly owned U.S. Pat. No. 8,503,213 issued 6 Aug. 2013, which is hereby incorporated by reference as if fully set forth herein. Insulating material is removed from the drawing to expose additional structure. For example, insulating layers are removed between the NAND strings in the stacks, and are removed between the stacks of NAND strings.

Alternative 3D NAND structures can be referred to as vertical channel NAND arrays, such as those described in our co-pending application Ser. No. 14/284,306 filed 21 May 2014, and application Ser. No. 14/582,963 filed 24 Dec. 2014, which are incorporated by reference as if fully set forth herein. Vertical channel NAND arrays also include blocks as described herein, and can be configured and operated for page erase using the biasing techniques described herein.

The 3D NAND-flash memory array structure in both the vertical channel and vertical gate structures includes stacked memory structures resulting in the array having a plurality of blocks of memory cells disposed in a dense configuration.

In the example shown in FIG. 3, the block of the multi-layer array is formed on an insulating layer, and includes a plurality of word lines 325-1, . . . , 325-N. The stacks include channel lines (e.g. 312, 313, 314, 315 in the first even page stack). The stack of channel lines 312, 313, 314, 315 is terminated at one end by the stairstep pads 312A, 313A, 314A, 315A, and passes through SSL switches 319, ground select line GSL 326, word lines 325-1 WL through 325-N WL, ground select line GSL 327, and terminates at the other end by source line 328. The stack of channel lines 312, 313, 314, 315 does not reach the stairstep pads 302B, 303B, 304B, 305B. Thus, the even block shares the even ground select line GSL and all the word lines, and the odd block shares the odd ground select line GSL and all the word lines. The even and odd blocks are interleaved in this example, allowing a unit that is N strings wide to operate with N/2 bit lines. Because of the proximity of the interleaved strings of memory cells in the even and odd blocks, the even and odd page blocks in this configuration can be operated together for an erase operation. Other embodiments do not use interleaved even and odd stacks.

The stack of channel lines 302, 303, 304, 305 in the first odd page stack, is terminated at one end by the stairstep pads 302B, 303B, 304B, 305B, and passes through SSL switches 309, ground select line GSL 327, word lines 325-N WL through 325-1 WL, ground select line GSL 326, and terminates at the other end by a source line (obscured by other parts of the figure). The stack of channel lines 302, 303, 304, 305 does not reach the stairstep pads 312A, 313A, 314A, 315A.

The shown word line numbering, ascending from 1 to N going from the back to the front of the overall structure, applies for a sequence going from SLL to GSL on even memory pages. For odd memory pages, the word line numbering descends from N to 1 going from the front to the back of the overall structure, applies for a sequence going from SSL to GLS on odd memory pages.

Stairstep pads 312A, 313A, 314A, 315A terminate channel lines in even pages, such as channel lines 312, 313, 314, 315. As illustrated, these stairstep pads 312A, 313A, 314A, 315A are electrically connected to different bit lines for connection to decoding circuitry to select layers of memory cells within the array. These stairstep pads 312A, 313A, 314A, 315A can be patterned at the same time that the plurality of stacks are defined.

Stairstep pads 302B, 303B, 304B, 305B terminate channel lines in odd pages, such as channel lines 302, 303, 304, 305. As illustrated, these stairstep pads 302B, 303B, 304B, 305B are electrically connected to different bit lines for connection to decoding circuitry to select layers of memory cells within the array. These stairstep pads 302B, 303B, 304B, 305B can be patterned at the same time that the plurality of stacks are defined.

Any given stack of channel lines is coupled to either the stairstep pads 312A, 313A, 314A, 315A on one end of the block, or the stairstep pads 302B, 303B, 304B, 305B on the other end of the block, but not both. Other blocks in an array of blocks can be electrically isolated from one another by the use of separate stacks of channel lines and stairstep pads that connect the channel lines in a block together, with insulating material disposed between them the separated stacks. In this way, the separate blocks can be operated independently for erase, if their control signals are separately decoded.

Ground select lines GSL 326 and GSL 327 are conformal with the plurality of stacks, similar to the word lines.

Every stack of channel lines is terminated at one end by a set of stairstep pads, and at the other end by a source line. For example, the stack of channel lines 312, 313, 314, 315 is terminated at one end by stairstep pads 312A, 313A, 314A, 315A, and terminated on the other end by source line 328. At the near end of the figure, every other stack of channel lines is terminated by the stairstep pads 302B, 303B, 304B, 305B, and every other stack of channel lines is terminated by a separate source line. At the far end of the figure, every other stack of channel lines is terminated by the stairstep pads 312A, 313A, 314A, 315A, and every other stack of channel lines is terminated by a separate source line.

Bit lines and string select lines can be formed at the metals layers ML1, ML2, and ML3.

Memory cells are formed with memory material between the channel lines and the word lines 325-1 through 325-N. In the memory cells, the channel line (e.g. 313) acts as the channel region of the device. SSL switches (e.g. 319, 309) can be patterned during the same step that the word lines 325-1 through 325-N are defined. The memory material can act as the gate dielectric for the SSL switches. The SSL switches can be coupled to decoding circuitry for selecting particular stacks in the array.

In the vertical gate 3D structure of FIG. 3, the block of memory cells includes a plurality of pages of memory cells, where a page can be defined, for the purpose of this description, in this structure as including the memory cells in one stack of channel lines, selected by a single SSL switch, where each channel line is coupled to a corresponding bit line via the stairstep pads. An array page can be defined as a plurality of pages from different blocks operated in parallel. The definition of a page and the decoding applied to access a page can vary as suits a particular memory architecture. The memory structure can include a page program buffer to which the set of N bit lines is coupled in parallel, for use in the program and program verify steps. In the illustrated example, there are four layers of memory cells, which provides for four bit lines per page. In other examples there are other numbers of layers. In one example considered herein, there can be eight layers, with eight even stacks and eight odd stacks, making a memory block including a total of 16 pages, where memory cells in each page are coupled to word lines 325-1 to 325-N.

The memory unit can be repeated left and right, to establish wider array pages, that include with four bits from each page in a row of blocks being selected by each word line that traverses the row of blocks. For a representative configuration storing N*8 megabytes of data in a row of blocks, an integrated circuit may include 8000 global bit lines, overlying rows of 1000 side-by-side blocks of cells each of which have sixteen pages of 512 N-bit cells coupled to eight global bit lines in the even/odd arrangement. Each row of blocks may have 64 word lines, and have a depth of eight layers making 256 cells in each of the even and odd blocks. Thus, a single eight layer strip selected by an SSL signal in a single block, will include 512 cells (64*8), each storing multiple bits of data. A block of sixteen such strips will have 8K cells.

A general issue of 3D NAND memories is that the size of a block of memory cells is often very large. As the density of 3D NAND memories increases, the number of pages and the number of layers increase, leading to larger block sizes and slower timing specification for block erase operations. The slower timing specification for block erase operations degrades the performance of a 3D NAND memory when a user only needs to change the code of a small unit stored in a sub-block of memory cells in the 3D NAND memory.

In the present technology, memory cells coupled to only some but not all pages in a block can be erased in a page erase operation. Furthermore, a set of word lines shared by a plurality of NAND strings can be divided into a first subset and a second subset of the set of word lines, allowing memory cells coupled to one of the first subset and the second subset of word lines and coupled to selected pages in a block to be erased, while inhibiting tunneling in memory cells coupled to the other one of the first subset and the second subset or coupled to unselected pages in the block. Consequently, only some but not all memory cells in a block can be erased in a page erase operation, thus enabling faster timing specification for page erase operations than for block erase operations and enhancing the performance of a 3D NAND memory.

A page erase command can be issued from a source external or internal to the memory. The page erase command can indicate in which page(s) in a selected block and at which word lines in the page(s) that memory cells are to be erased. Pages to be erased can be logically selected. The page erase command can include a parameter indicating in which pages to erase memory cells. Furthermore, a number of word lines for the first subset of the set of word lines can be logically selected. For instance, the page erase command can include a parameter indicating the number of word lines, for erasing memory cells coupled to the first subset of the set of word lines and coupled to the selected subset of the first string select switches (SSL).

Figure 4:
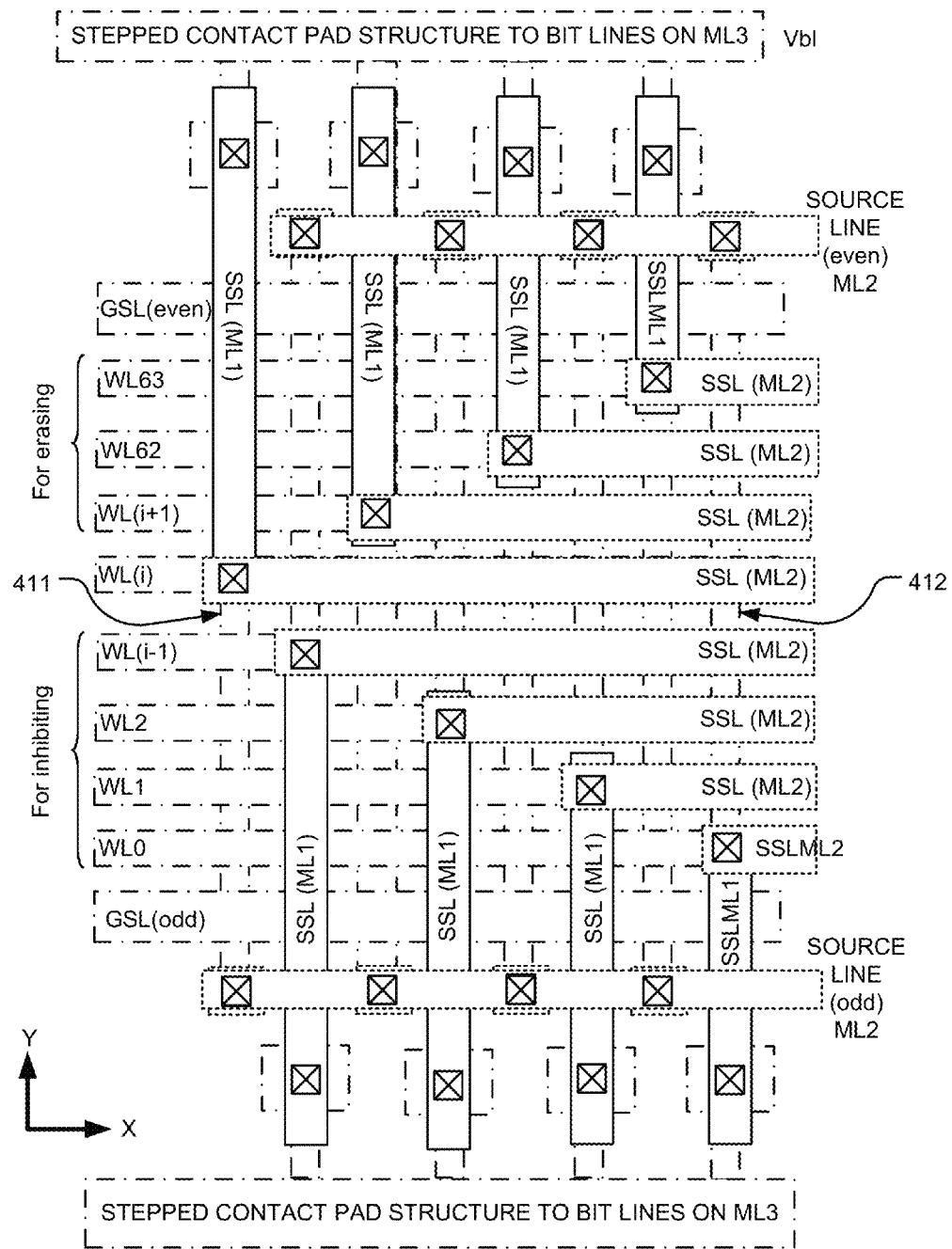
FIG. 4 is an example layout view of the 3D NAND-flash memory array structure of FIG. 3.

FIG. 4 is an example layout view of the 3D NAND-flash memory array structure of FIG. 3. The 3D NAND-flash memory array structure includes a plurality of blocks of memory cells. A block of memory cells includes a plurality of NAND strings having channel lines between first string select switches (e.g. SSL) and second string select switches (e.g. GSL), and in which the plurality of NAND strings shares a set of word lines (e.g. WL0-WL63) between the first and second string select switches.

In the layout view of FIG. 4, stacks of channel lines are shown as vertical strips with dot-dash borders. Adjacent stacks of channel lines alternate between the even and odd orientations. Every odd stack of channel lines (e.g. 411) runs from the bit line contact pad structure at the top to the odd source line at the bottom. Every even stack of channel lines (e.g. 412) runs from the bit line contact pad structure at the bottom to the even source line structure at the top.

Overlying the stacks of channel lines, are the horizontal word lines and the horizontal ground select lines GSL (even) and GSL (odd). Also overlying the stacks of channel lines, are the SSL switches. The odd SSL switches overlie every other stack of channel lines at the top end of the channel lines, and the even SSL switches overlie every other stack of channel lines at the bottom end of the channel lines. In either case, the SSL switches control electrical connection between any stack of channel lines and the stack's corresponding bit line contact stairstep pads.

As shown in the example of FIG. 4, a set of word lines including word lines WL0, WL1 to WL(i-2), WL(i-1), WL(i), WL(i+1), WL62 to WL63, extend in parallel along a first direction. The set of word lines can include a first subset including word lines WL(i) and a number of word lines adjacent to WL(i) such as WL(i-1) and WL(i+1), and a second subset including some or all of word lines not in the first subset. The second subset can include word lines between the first subset and WL0, and between the first subset and WL63. The word lines are in electrical communication with row decoder 261 (FIG. 2). The word lines are connected to the gates of the memory cells, which are arranged in series as NAND strings.

Overlying the word lines, ground select lines, and SSL switches, are the ML1 SSL string select lines running vertically. Overlying the ML1 SSL string select lines are the ML2 SSL string select lines running horizontally. Although the ML2 SSL string select lines are shown as terminating at corresponding ML1 SSL string select lines for ease of viewing the structure, the ML2 SSL string select lines may run longer horizontally. The ML2 SSL string select lines carry signals from the decoder, and the ML1 SSL string select lines couple these decoder signals to particular SSL switches to select particular stacks of channel lines.

Also overlying the ML1 SSL string select lines are the source lines, even and odd. Further, overlying the ML2 SSL string select lines are the ML3 bit lines (not shown) which connect to the stairstep contact structures at the top and the bottom. Through the stairstep contact structures, the bit lines select particular layers of channel lines.

Particular bit lines can be electrically connected to different layers of channel lines. The SSLs of the particular bit lines can be biased to connect the particular bit lines to different layers of channel lines.

FIG. 5 is a circuit diagram showing example NAND strings in an X-Y plane in a block of memory cells connected to a first configuration of local and global word line drivers in a 3D memory. The NAND strings correspond to four pages of memory cells: Page 0, Page 1, Page 2 and Page 3. The NAND strings can be disposed on the same layer of the 3D array like that of FIG. 2, sharing even and odd GSL lines for the even and odd pages, and having separate SSL lines coupled to global bit lines BL-N at even and odd bit line contact structures on opposing ends of the block like that shown in FIG. 2, and to even and odd common source CS lines 520 and 521. The strings are connected to the corresponding global bit lines BL-0 to BL-3 by respective first string select switches (e.g. 530, 531, 532 and 533), also referred to as SSL switches. The strings are connected to the even or odd common source line for the plane by respective second string select switches (e.g. 540, 541), also referred to as ground select switches. A plurality of NAND strings in a block of memory cells has channel lines between the first string select switches and the second string select switches, and shares a set of word lines (e.g. WL0-WL1, . . . WL(i−n−2), WL(i−n−1), WL(i−n), . . . WL(i), . . . WL(i+n), WL(i+n+1), WL(i+n+2), . . . WL62-WL63) between the first and second string select switches.

The memory can include a set of local word line drivers (e.g. 560-570), abbreviated as LWLD, that drives respective word lines in the set of word lines in a selected block of memory cells. The set of local word line drivers can include a first subset of the set of local word line drivers (e.g. 564-566) and a second subset of the set of local word line drivers (e.g. 567-570 and 560-563). The first subset of the set of local word line drivers can drive a first subset of the set of word lines (e.g. 551) including word lines WL(i-n), . . . WL(i), . . . WL(i+n). The second subset of the set of local word line drivers can drive a second subset of the set of word lines (e.g. 552) including word lines between the first subset and WL0 (e.g. WL0-WL1, . . . WL(i−n−2), WL(i−n−1)), and between the first subset and WL63 (e.g. WL(i+n+1), WL(i+n+2), . . . WL62-WL63).

The memory can include a set of global word lines, including first global word lines (e.g. 511g) connected to the first subset of the set of local word line drivers and to the second subset of the set of local word line drivers. The memory includes a global word line driver (e.g. 511) that drives the N first global word lines 511g, in which there are N global word line signals provided in parallel for connection to selected blocks by the local word line decoder and local word line drivers in this example. Only one set of even and odd blocks is illustrated in this example. But the global word lines can connect to the local word line drivers for many blocks.

A global word line decoder (e.g. 590), abbreviated as GWL decoder, is connected to the global word line drivers using a conductor (e.g. 595) in a patterned conductor layer. The conductor can carry one or more output signals to the global word line drivers. A local word line decoder (e.g. 580), abbreviated as LWL decoder, is connected to the local word line drivers (e.g. 560-570) using conductors in patterned conductor layers, for connection of power signals, bias signals, address signals and/or other control signals to the local word line drivers. The connection from the local word line decoder 580 can include a control signal line 585 carrying control signals to each local word line driver in the first subset of the set of local word line drivers in the block, and to each local word line driver in the second sub-set of the set of local word line drivers in the block.

A local word line driver (e.g. 566) can include an NMOS (N-type metal oxide semiconductor) transistor that has an input connected to a global word line (e.g. 511g) in the set of global word lines, an output connected to a word line (e.g. WL(i+n)) in the set of word lines, and a control gate connected to a control signal (e.g. from control signal line 585) from a local word line decoder (e.g. 580). A global word line driver (e.g. 511) can include a level shifter that shifts output voltage levels according to one or more output signals from a global word line decoder (e.g. 590). For instance, the level shifter can vary the output voltage levels according to requirements by page erase operations, and according to requirements by read, write and block erase operations.

Representative page erase bias voltages using the first configuration of local and global word line drivers can be understood based on Table 1.

TABLE 1

Representative Page Erase Bias Voltages Using the First Configuration

| Signals | Voltage |
| --- | --- |
| BL | +3.3 V |
| Selected SSL | −6 V |
| Unselected SSL | +3.3 V |
| Word lines for erasing | −10 V |
| GSL | +3.3 V |
| CSL | +3.3 V |

In FIG. 5, a channel-side voltage (e.g. +3.3V) can be applied to the channel lines of the NAND strings at different layers in a selected block through the first string select switches (e.g. 530, 531, 532, 533). A control voltage (e.g. −6V) lower than the channel-side voltage (e.g. 3.3V) can be applied to a selected subset of the first string select switches (SSL) to generate GIDL (gate induced drain leakage) at ends of the first string select switches. The selected subset of the first string select switches (e.g. 530) can include one or more first string select switches. GIDL generated at ends of the first string select switches (SSL) predominates the page erase operation, and the channel lines are charged to the channel-side voltage (e.g. $V_{BL}$=+3.3V). When the control voltage is applied, a plurality of bit lines is connected to different layers of channel lines in a selected page including strings of memory cells at the different layers selected by the selected subset of the first string select switches, for erasing memory cells in the selected page. The channel-side voltage (e.g. +3.3V) can be applied to the unselected subset of the first string select switches, when the channel-side voltage is applied to the channel lines through the first string selected switches in the selected block.

Word line-side erase voltages (−10V) can be applied to the set of word lines (e.g. WL0-WL63) in the selected block, for example via the first global word lines (e.g. 511g), to induce tunneling, such as hole tunneling, in memory cells coupled to the set of word lines and coupled to the selected subset of the first string select switches (e.g. 530).

The channel lines at ends of the second string select switches (GSL) can be floated, for example, by applying the channel-side voltage (e.g. 3.3V) via a common source line (CSL) to the channel lines through the second string select switches (GSL), and to the second string select switches (GSL). Consequently, GIDL is not generated at ends of the second string select switches (GSL). Tunneling in memory cells coupled to an unselected subset of the first string select switches can be inhibited, for example, by applying the channel-side voltage (e.g. 3.3V) to the unselected subset of the first string select switches when applying the channel-side voltage (e.g. 3.3V) to the channel lines coupled to the unselected subset of the first string select switches in the selected block. Consequently, first string select switches in the unselected subset of the first string select switches (SSL) are turned off, without providing GIDL generation, and the channel lines coupled to the unselected subset of the first string select switches (SSL) are floating without GIDL generation.

FIG. 6 is a circuit diagram showing example NAND strings in an X-Y plane in a block of memory cells connected to a second configuration of local and global word line drivers in a 3D memory. The circuit shown in FIG. 6 is similar to the circuit shown in FIG. 5. Like elements in FIG. 6 are commonly referred to with like reference numerals as in FIG. 5.

The memory can include a set of local word line drivers (e.g. 560-570), abbreviated as LWLD, that drives respective word lines in the set of word lines in a selected block of memory cells. The set of local word line drivers can include a first subset of the set of local word line drivers (e.g. 564-566) and a second subset of the set of local word line drivers (e.g. 567-570 and 560-563). The first subset of the set of local word line drivers can drive a first subset of the set of word lines (e.g. 651) including word lines WL(i−n), . . . WL(i), . . . WL(i+n). The second subset of the set of local word line drivers can drive a second subset of the set of word lines (e.g. 652) including word lines between the first subset and WL0 (e.g. WL0-WL1, . . . WL(i−n−2), WL(i−n−1)), and between the first subset and WL63 (e.g. WL(i+n+1), WL(i+n+2), . . . WL62-WL63).

The memory can include a set of global word lines, including first global word lines (e.g. 511g) connected to the first subset of the set of local word line drivers, and second global word lines (e.g. 512g) connected to the second subset of the set of local word line drivers. The memory includes a first global word line driver (e.g. 511) that drives the first global word lines 511g, and a second global word line driver (e.g. 512) that drives the second global word lines 512g. Only one set of even and odd blocks is illustrated in this example. But the global word lines can connect to the local word line drivers for many blocks.

Description about a global word line decoder (e.g. 590), a local word line decoder (e.g. 580), a local word line driver (e.g. 566), and a global word line driver (e.g. 511) in connection with FIG. 5 are generally applicable to like elements in FIG. 6.

Representative page erase bias voltages using the second configuration of local and global word line drivers can be understood based on Table 2.

TABLE 2

Representative Page Erase Bias Voltages Using the Second

| Signals | Voltage |
|---|---|
| BL | +3.3 V |
| Selected SSL | −6 V |
| Unselected SSL | +3.3 V |
| Selected word lines for erasing | −10 V |
| Unselected word lines | −2 V to 6 V |
| GSL | +3.3 V |
| CSL | +3.3 V |

In FIG. 6, a channel-side voltage (e.g. +3.3V) can be applied to the channel lines of the NAND strings at different layers in a selected block through the first string select switches (e.g. 530, 531, 532, 533) in a selected block. A control voltage (e.g. −6V) lower than the channel-side voltage (e.g. 3.3V) can be applied to a selected subset of the first string select switches (SSL) to generate GIDL (gate induced drain leakage) at ends of the first string select switches. The selected subset of the first string select switches (e.g. 530) can include one or more first string select switches. GIDL generated at ends of the first string select switches (SSL) predominates the page erase operation, and the channel lines are charged to the channel-side voltage (e.g. $V_{BL}$=+3.3V). When the control voltage is applied, a plurality of bit lines is connected to different layers of channel lines in a selected page including strings of memory cells at the different layers selected by the selected subset of the first string select switches, for erasing memory cells in the selected page. The channel-side voltage (e.g. +3.3V) can be applied to the unselected subset of the first string select switches, when the channel-side voltage is applied to the channel lines through the first string selected switches in the selected block.

Word line-side erase voltages (−10V) can be applied to a selected subset (e.g. WL(i−n)-WL(i+n)) of the set of word lines (e.g. WL0-WL(63)) in the selected block, for example via the first global word lines (e.g. 511g), to induce tunneling, such as hole tunneling, in memory cells coupled to the selected subset the set of word lines and coupled to the selected subset of the first string select switches (e.g. 530). Word line-side inhibit voltages (e.g. 4V) can be applied, for example via the second global word lines (e.g. 512g), to an unselected subset (e.g. WL0-WL(i−n−1) and WL(i+n+1)-WL63) of the set of word lines (e.g. WL0-WL63) to inhibit tunneling in memory cells coupled to the unselected subset of the set of word lines and coupled to the unselected subset (e.g. 530) of the first string select switches.

The channel lines at ends of the second string select switches (GSL) can be floated, for example, by applying the channel-side voltage (e.g. 3.3V) via a common source line (CSL) to the channel lines through the second string select switches (GSL), and to the second string select switches (GSL). Consequently, GIDL is not generated at ends of the second string select switches (GSL). Tunneling in memory cells coupled to an unselected subset of the first string select switches can be inhibited, for example, by applying the channel-side voltage (e.g. 3.3V) to the unselected subset of the first string select switches when applying the channel-side voltage (e.g. 3.3V) to the channel lines coupled to the unselected subset of the first string select switches in the selected block. Consequently, first string select switches in the unselected subset of the first string select switches (SSL) are turned off, without providing GIDL generation, and the channel lines coupled to the unselected subset of the first string select switches (SSL) are floating without GIDL generation.

Figure 7:
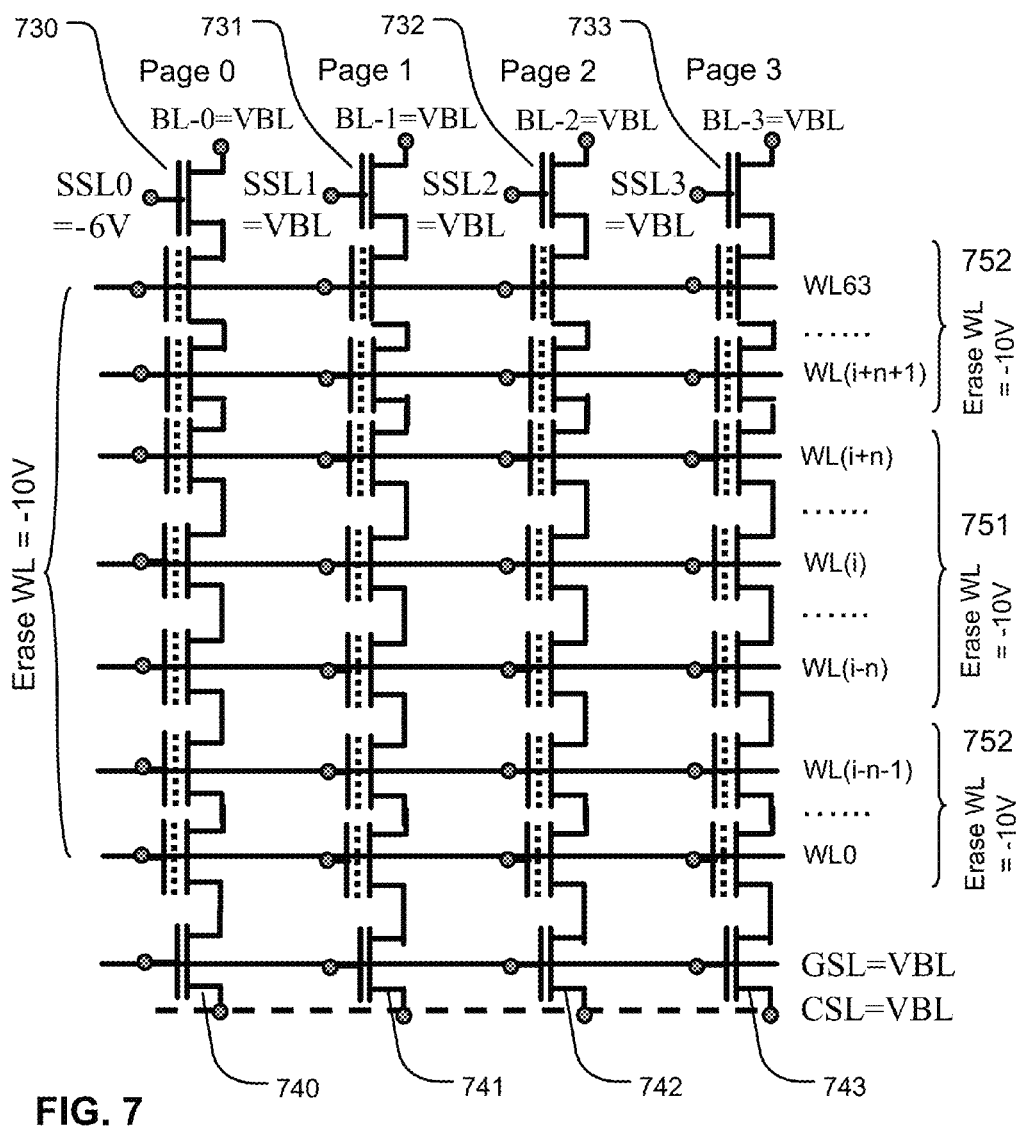
FIG. 7 is a circuit diagram showing example NAND strings in an X-Y plane in a block of memory cells connected to a first configuration of local and global word line drivers in an alternative 3D memory.

FIG. 7 is a circuit diagram showing example NAND strings in an X-Y plane in a block of memory cells connected to a first configuration of local and global word line drivers in an alternative 3D memory. The alternative 3D memory is like a so called IDG (independent double gate) structure, which uses one set of first string select switches (SSL) on one end of a block, and one set of second string select switches (GSL) and one common source line (CSL) on another end of the block, instead of two sets of first string select switches (SSL), two second string select switches, and two common source lines on opposing ends of a block as in the odd and even configuration shown in FIGS. 5 and 6 that have even and odd pages.

The NAND strings of memory cells correspond to four pages of memory cells: Page 0, Page 1, Page 2 and Page 3. The NAND strings can be disposed on the same layer of a 3D array, sharing a ground select line (GSL) and a common source line (CSL) on one end of the block for the four pages, and having separate SSL lines (e.g. SSL0, SSL1, SSL2 and SSL3) coupled to global bit lines BL-N (e.g. BL-0, BL-1, BL-2, BL-3) at bit line contact structures on another end of the block. The strings are connected to the corresponding global bit lines BL-0 to BL-3 by respective first string select switches (e.g. 730, 731, 732 and 733), also referred to as string select switches. The strings are connected to the common source line by respective second string select switches (e.g. 740, 741, 742 and 743), also referred to as ground select switches. A plurality of NAND strings in a block of memory cells has channel lines between the first string select switches and the second string select switches, and shares a set of word lines (e.g. WL0- . . . WL(i−n−1), WL(i−n), . . . WL(i), . . . WL(i+n), WL(i+n+1), . . . WL63) between the first and second string select switches.

Description about a global word line decoder (e.g. 590), a local word line decoder (e.g. 580), local word line drivers (e.g. 566), and a global word line driver (e.g. 511) in connection with FIG. 5 are generally applicable to like elements in the alternative 3D memory shown in FIG. 7.

The alternative 3D memory can include a set of local word line drivers (not shown) that drives respective word lines in the set of word lines (e.g. WL0- . . . WL(i−n−1), WL(i−n), . . . WL(i), . . . WL(i+n), WL(i+n+1), . . . WL63) in a selected block of memory cells. The set of local word line drivers can include a first subset of the set of local word line drivers and a second subset of the set of local word line drivers. The first subset of the set of local word line drivers can drive a first subset of the set of word lines (e.g. 751) including word lines WL(i−n), . . . WL(i), . . . WL(i+n). The second subset of the set of local word line drivers can drive a second subset of the set of word lines (e.g. 751) including word lines between the first subset and WL0 (e.g. WL0, . . . WL(i−n−1)), and between the first subset and WL63 (e.g. WL(i+n+1), . . . WL63).

The alternative 3D memory can include a set of global word lines (not shown), including first global word lines connected to the first subset of the set of local word line drivers and to the second subset of the set of local word line drivers. The memory can include a global word line driver (e.g. 511, FIG. 5) that drives the first global word lines.

A global word line decoder (e.g. 590, FIG. 5) can be connected to the global word line drivers using a conductor in a patterned conductor layer. The conductor can carry one or more output signals to the global word line drivers. A local word line decoder (e.g. 580, FIG. 5) can be connected to the local word line drivers using conductors in patterned conductor layers, for connection of power signals, bias signals, address signals and/or other control signals to the local word line drivers.

Description about the operation of the 3D memory in connection with FIG. 5, including the representative page erase bias voltages in Table 1, is generally applicable to the operation of the alternative 3D memory shown in FIG. 7 that is like a so called IDG (independent double gate) structure, including the first configuration of local and global word line drivers.

Figure 8:
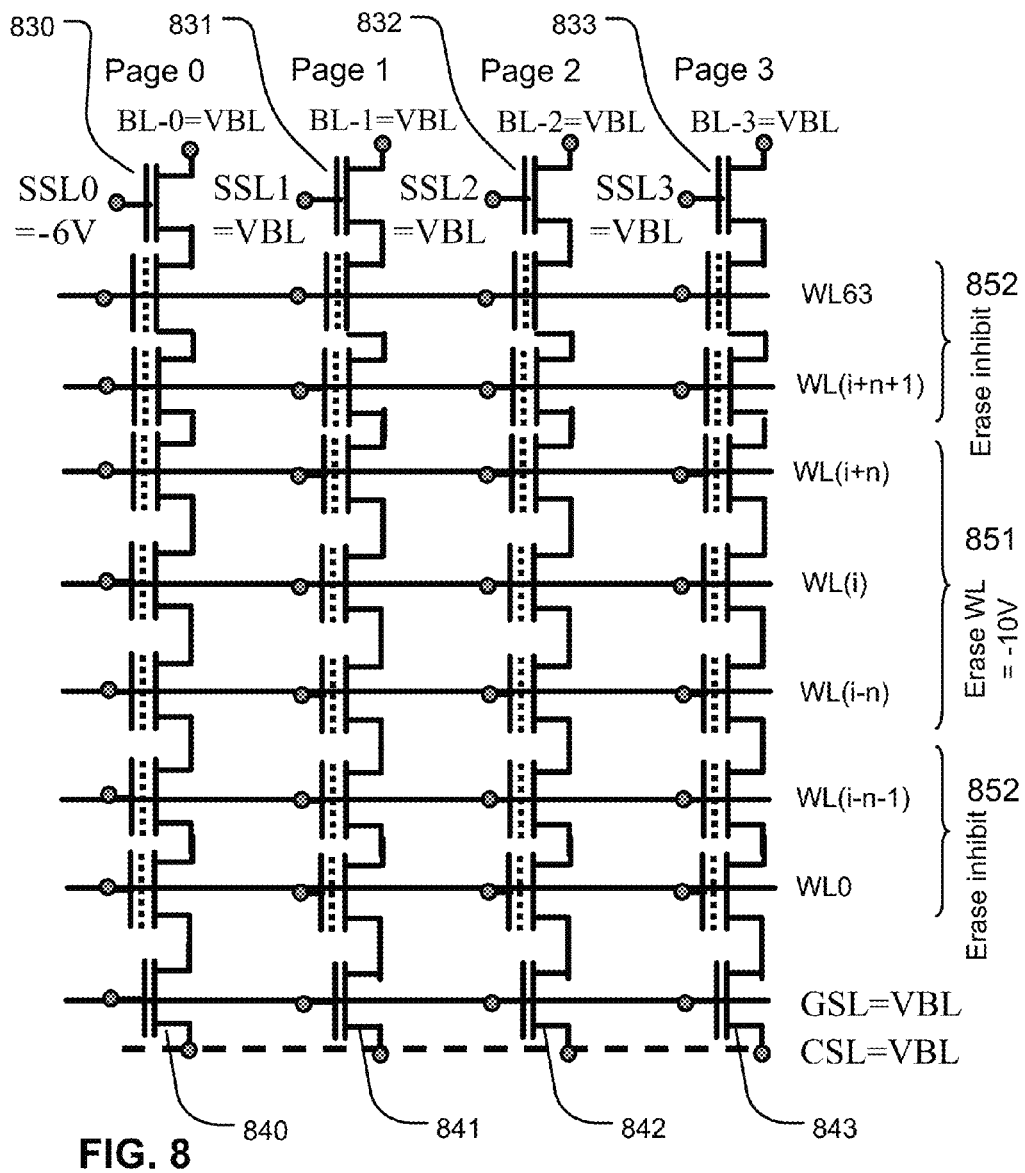
FIG. 8 is a circuit diagram showing example NAND strings in an X-Y plane in a block of memory cells connected to a second configuration of local and global word line drivers in an alternative 3D memory.

FIG. 8 is a circuit diagram showing example NAND strings in an X-Y plane in a block of memory cells connected to a second configuration of local and global word line drivers in an alternative 3D memory. The alternative 3D memory is like a so called IDG (independent double gate) structure, which uses one set of first string select switches (SSL) on one end of a block, and one set of second string select switches (GSL) and one common source line (CSL) on another end of the block, instead of two sets of first string select switches (SSL), two second string select switches, and two common source lines on opposing ends of a block as in the odd and even configuration shown in FIGS. 5 and 6 that have even and odd pages.

The NAND strings of memory cells correspond to four pages of memory cells: Page 0, Page 1, Page 2 and Page 3. The NAND strings can be disposed on the same layer of a 3D array, sharing a ground select line (GSL) and a common source line (CSL) on one end of the block for the four pages, and having separate SSL lines (e.g. SSL0, SSL1, SSL2 and SSL3) coupled to global bit lines BL-N (e.g. BL-0, BL-1, BL-2, BL-3) at bit line contact structures on another end of the block. The strings are connected to the corresponding global bit lines BL-0 to BL-3 by respective first string select switches (e.g. 830, 831, 832 and 833), also referred to as string select switches. The strings are connected to the common source line by respective second string select switches (e.g. 840, 841, 842 and 843), also referred to as ground select switches. A plurality of NAND strings in a block of memory cells has channel lines between the first string select switches and the second string select switches, and shares a set of word lines (e.g. WL0- . . . WL(i−n−1), WL(i−n), . . . WL(i), . . . WL(i+n), WL(i+n+1), . . . WL63) between the first and second string select switches.

Description about a global word line decoder (e.g. 590), a local word line decoder (e.g. 580), local word line drivers (e.g. 566), and global word line drivers (e.g. 511 and 512) in connection with FIG. 6 are generally applicable to like elements in the alternative 3D memory shown in FIG. 8.

The alternative 3D memory can include a set of local word line drivers (not shown) that drives respective word lines in the set of word lines (e.g. WL0- . . . WL(i−n−1), WL(i−n), . . . WL(i), . . . WL(i+n), WL(i+n+1), . . . WL63) in a selected block of memory cells. The set of local word line drivers can include a first subset of the set of local word line drivers and a second subset of the set of local word line drivers. The first subset of the set of local word line drivers (e.g. 851) can drive a first subset of the set of word lines including word lines WL(i−n), . . . WL(i), . . . WL(i+n). The second subset of the set of local word line drivers (e.g. 852) can drive a second subset of the set of word lines including word lines between the first subset and WL0 (e.g. WL0, . . . WL(i−n−1)), and between the first subset and WL63 (e.g. WL(i+n+1), . . . WL63).

The alternative 3D memory can include a set of global word lines (not shown), including first global word lines connected to the first subset of the set of local word line drivers, and second global word lines connected to the second subset of the set of local word line drivers. The memory can include a first global word line driver (e.g. 511, FIG. 6) that drives the first global word lines and a second global word line driver (e.g. 512, FIG. 6) that drives the second global word lines.

A global word line decoder (e.g. 590, FIG. 6) can be connected to the first and second global word line drivers using a conductor in a patterned conductor layer. The conductor can carry one or more output signals to the global word line drivers. A local word line decoder (e.g. 580, FIG. 6) can be connected to the local word line drivers using conductors in patterned conductor layers, for connection of power signals, bias signals, address signals and/or other control signals to the local word line drivers.

Description about the operation of the 3D memory in connection with FIG. 6, including the representative page erase bias voltages in Table 2, is generally applicable to the operation of the alternative 3D memory shown in FIG. 8 that is like a so called IDG (independent double gate) structure, including the second configuration of local and global word line drivers.

Figure 9:
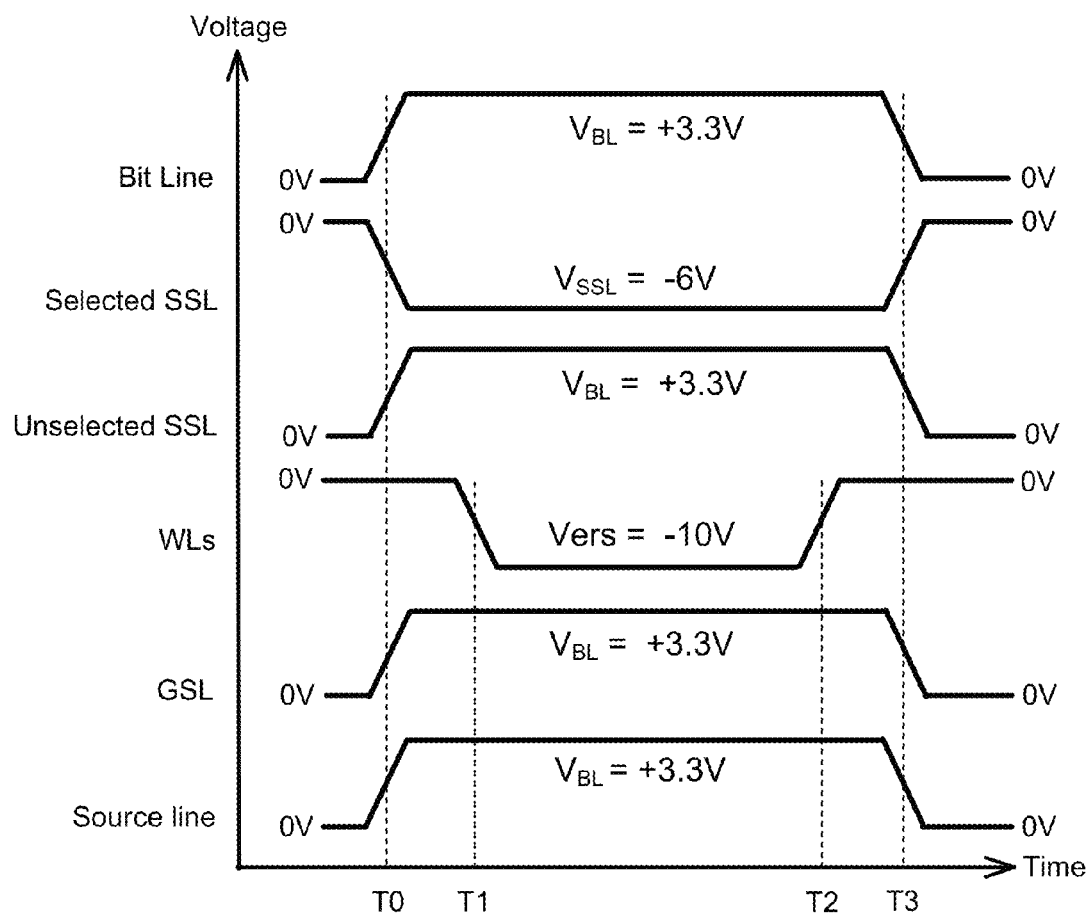
FIG. 9 is a timing diagram suitable for use with the page erase operations as described in connection with the circuit shown in FIGS. 5 and 7.

FIG. 9 is a timing diagram suitable for use with the page erase operations as described in connection with the circuits shown in FIGS. 5 and 7. As described for FIGS. 5 and 7, a block of memory cells includes a plurality of NAND strings that have channel lines between first string select switches (SSL) and second string select switches (GSL), and in which the plurality of NAND strings shares a set of word lines between the first and second string select switches.

At the beginning of a page erase cycle, before time T0, voltages on the bit lines, the selected SSL lines for erasing, the unselected SSL lines for inhibiting, the word lines (WLs), the ground select line (GSL), and the source line (CSL) can be at initial values such as 0V. At time T0, a channel-side voltage (e.g. $V_{BL}=+3.3V$) is applied to the channel lines at different layers in a selected block through the first string select switches (e.g. SSL switches). At time T0, a control voltage (e.g. $V_{SSL}=-6V$) lower than the channel-side voltage is applied to a selected subset of the first string select switches to generate GIDL (gate induced drain leakage) at ends of the first string select switches (SSL). GIDL generated at ends of the first string select switches (SSL) predominates the page erase operation, and the channel lines are charged to the channel-side voltage (e.g. $V_{BL}=+3.3V$).

The channel lines can be floated at ends of the second string select switches (GSL), for example, by applying the channel-side voltage (e.g. $V_{BL}=+3.3V$) to the channel lines from the source line through the second string select switches (GSL), and to the second string select switches (SSL). Consequently, GIDL is not generated at ends of the second string select switches (GSL). Tunneling in memory cells coupled to an unselected subset of the first string select switches (SSL) can be inhibited, for example, by applying the channel-side voltage (e.g. $V_{BL}=+3.3V$) to the unselected subset of the first string select switches when applying the channel-side voltage to the channel lines coupled to the unselected subset. Consequently, first string select switches in the unselected subset of the first string select switches (SSL) are turned off, without providing GIDL generation, and the channel lines coupled to the unselected subset of the first string select switches (SSL) are floating without GIDL generation.

At time T1 subsequent to time T0, word line-side erase voltages (e.g. Vers=−10V) are applied to the set of word lines in the selected block to induce tunneling, such as hole tunneling, in memory cells coupled to the set of word lines and coupled to the selected subset of the first string select switches (SSL), and the memory cells are erased. At time T2, the voltages on the set of word lines in the selected block can return to about 0V. At time T3, the page erase cycle ends, and other voltages can also return to about 0V.

As word line-side erase voltages (e.g. Vers=−10V) are applied to the set of word lines in the selected block, the channel lines connected to the unselected subset of the first string select switches (SSL) are electrically coupled with the set of word lines, such that voltage potentials of the channel lines depend on the word line-side erase voltages and a coupling ratio. A minor discrepancy in voltage potential between the set of word lines and the channel lines provides the capability in erase inhibition at the unselected subset of the first string select switches (SSL).

Figure 10:
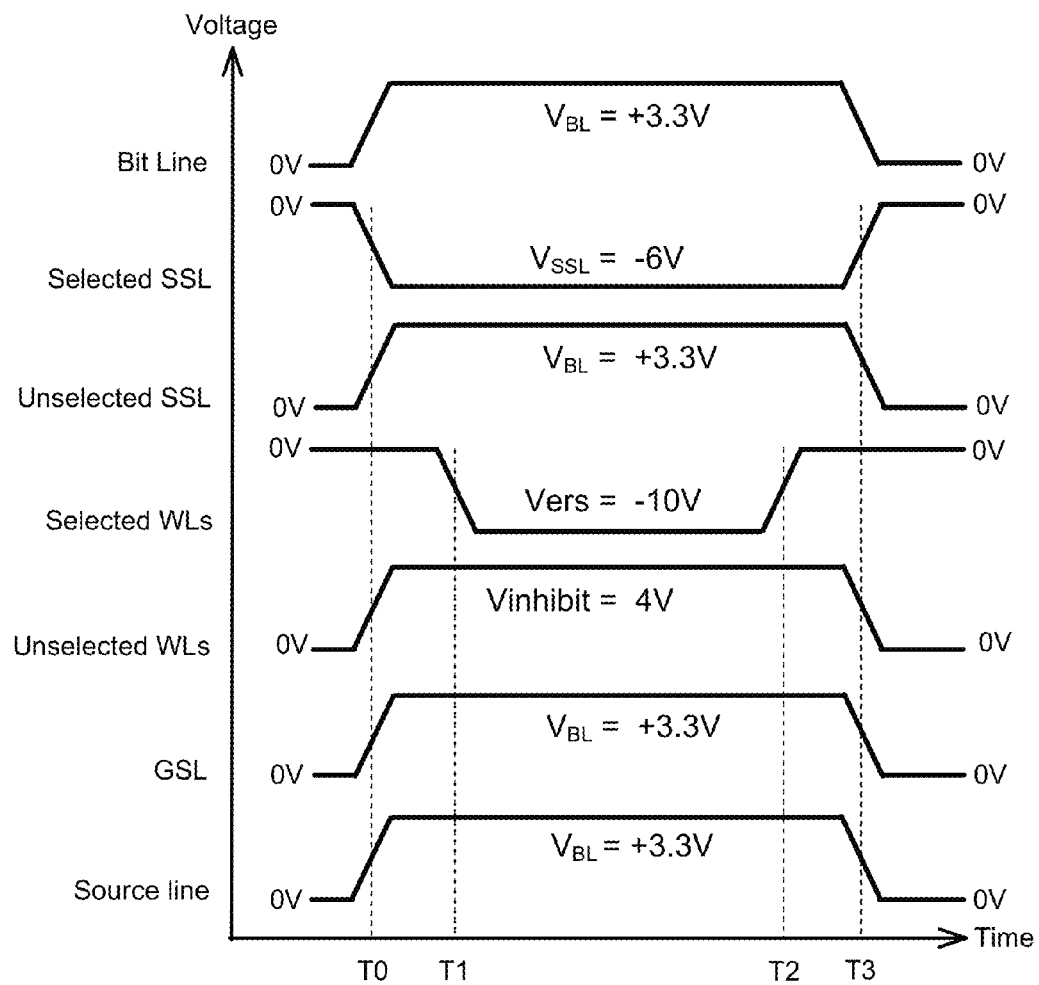
FIG. 10 is a timing diagram suitable for use with the page erase operations as described in connection with the circuit shown in FIGS. 6 and 8.

FIG. 10 is a timing diagram suitable for use with the page erase operations as described in connection with the circuits shown in FIGS. 6 and 8. As described for FIGS. 6 and 8, a block of memory cells includes a plurality of NAND strings that have channel lines between first string select switches (SSL) and second string select switches (GSL), and in which the plurality of NAND strings shares a set of word lines between the first and second string select switches.

At the beginning of a page erase cycle, before time T0, voltages on the bit lines, the selected SSL lines for erasing, the unselected SSL lines for inhibiting, the word lines (WLs), the ground select line (GSL), and the source line (CSL) can be at initial values such as 0V. At time T0, a channel-side voltage (e.g. $V_{BL}=+3.3V$) is applied to the channel lines at different layers in a selected block through the first string select switches (e.g. SSL switches). At time T0, a control voltage (e.g. $V_{SSL}=-6V$) lower than the channel-side voltage is applied to a selected subset of the first string select switches to generate GIDL (gate induced drain leakage) at ends of the first string select switches (SSL). GIDL generated at ends of the first string select switches (SSL) predominates the page erase operation, and the channel lines are charged to the channel-side voltage (e.g. $V_{BL}=+3.3V$).

The channel lines can be floated at ends of the second string select switches (GSL), for example, by applying the channel-side voltage (e.g. $V_{BL}=+3.3V$) to the channel lines from the source line through the second string select switches (GSL), and to the second string select switches. Consequently, GIDL is not generated at ends of the second string select switches (GSL). Tunneling in memory cells coupled to an unselected subset of the first string select switches (SSL) can be inhibited, for example, by applying the channel-side voltage (e.g. $V_{BL}=+3.3V$) to the unselected subset of the first string select switches when applying the channel-side voltage to the channel lines coupled to the unselected subset. Consequently, first string select switches in the unselected subset of the first string select switches (SSL) are turned off, without providing GIDL generation, and the channel lines coupled to the unselected subset of the first string select switches (SSL) are floating without GIDL generation.

At time T0, word line-side inhibit voltages can be applied to an unselected subset of the set of word lines to inhibit tunneling in memory cells coupled to the unselected subset of the set of word lines and coupled to the unselected subset of the first string select switches. At time T1 subsequent to time T0, word line-side erase voltages (e.g. Vers=−10V) can be applied to a selected subset of the set of word lines in the selected block to induce tunneling, such as hole tunneling, in memory cells coupled to the selected subset of the set of word lines and coupled to the selected subset of the first string select switches (SSL), and the memory cells are erased. At time T2, the voltages on the selected subset of the set of word lines in the selected block can return to about 0V. At time T3, the page erase cycle ends, and other voltages can also return to about 0V.

As word line-side erase voltages (e.g. Vers=−10V) are applied to the set of word lines in the selected block, the channel lines connected to the unselected subset of the first string select switches (SSL) are electrically coupled with the set of word lines, such that voltage potentials of the channel lines depend on the word line-side erase voltages and a coupling ratio. A minor discrepancy in voltage potential between the set of word lines and the channel lines provides the capability in erase inhibition at the unselected subset of the first string select switches (SSL).

Figure 11:
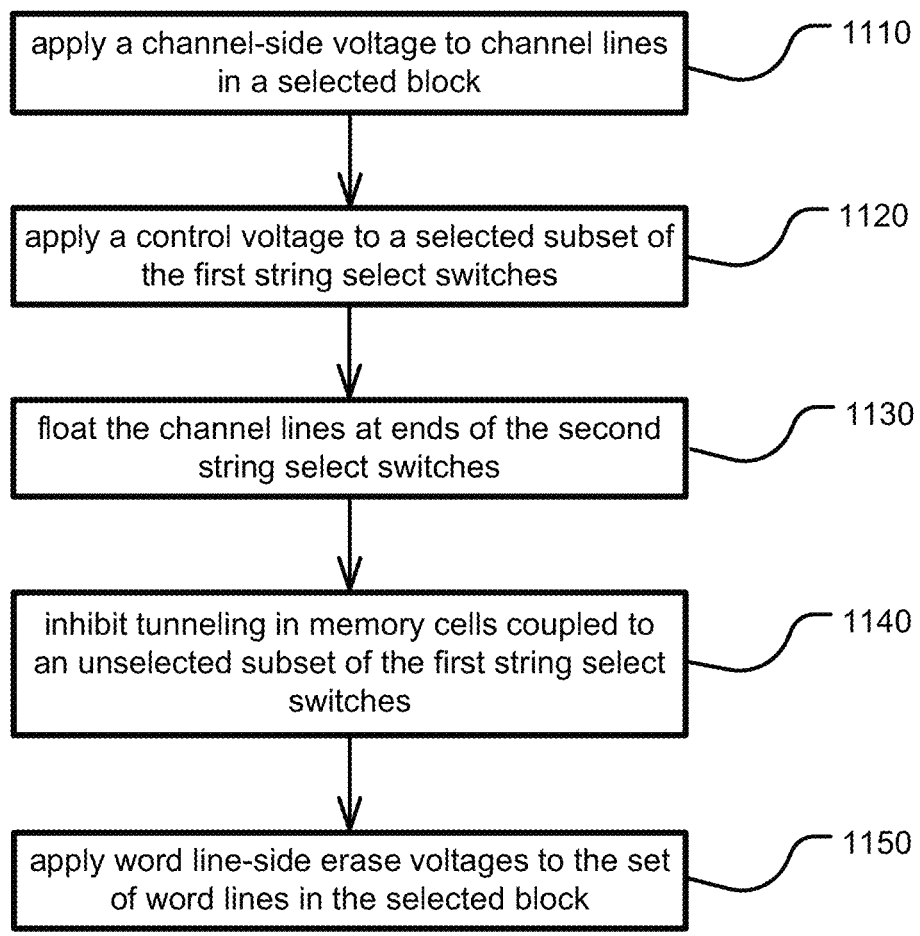
FIG. 11 is a flowchart of a procedure which can be used for page erase operations as described herein.

FIG. 11 is a flowchart of a procedure which can be used for page erase operations as described herein. A controller, such as implemented as a state machine 119 in an integrated circuit 100 (FIG. 1), can carry out the various operations in the procedure.

The controller can receive a page erase command from a source external to or internal to the memory. The page erase command can indicate in which page(s) in a selected block and at which word lines in the page(s) that memory cells are to be erased. Pages to be erased can be logically selected. The page erase command can include a parameter indicating in which pages to erase memory cells. Furthermore, a number of word lines for the first subset of the set of word lines can be logically selected. For instance, the page erase command can include a parameter indicating the number of word lines, for erasing memory cells coupled to the first subset of the set of word lines and coupled to the selected subset of the first string select switches (SSL). In response to the page erase command, steps illustrated in FIG. 11 can be executed.

At Step 1110, a channel-side erase voltage (e.g. +3.3V) can be applied to the channel lines at different layers in a selected block of memory cells through the first string select switches (e.g. 530, 531, 532 and 533, FIG. 5). At Step 1120, a control voltage (e.g. $V_{SSL}$=−6V) lower than the channel-side voltage can be applied to a selected subset of the first string select switches (SSL) to generate GIDL (gate induced drain leakage) at ends of the first string select switches (SSL). GIDL generated at ends of the first string select switches (SSL) predominates the page erase operation, and the channel lines are charged to the channel-side voltage (e.g. $V_{BL}$=+3.3V).

At Step 1130, the channel lines can be floated at ends of the second string select switches (GSL), for example, by applying the channel-side voltage to the channel lines from the source line through the second string select switches (GSL), and to the second string select switches (GSL). Consequently, GIDL is not generated at ends of the second string select switches (GSL). At Step 1140, tunneling in memory cells coupled to an unselected subset of the first string select switches (SSL) can be inhibited, for example, by applying the channel-side voltage (e.g. $V_{BL}$=+3.3V) to the unselected subset of the first string select switches when applying the channel-side voltage to the channel lines coupled to the unselected subset. Consequently, first string select switches in the unselected subset of the first string select switches (SSL) are turned off, without providing GIDL generation, and the channel lines coupled to the unselected subset of the first string select switches (SSL) are floating without GIDL generation.

At Step 1150, for a block of memory cells connected to a first configuration of local and global word line drivers as shown in FIG. 5, word line-side erase voltages (e.g. Vers=−10V) can be applied to the set of word lines in the selected block to induce tunneling, such as hole tunneling, in memory cells coupled to the set of word lines and coupled to the selected subset of the first string select switches (SSL), and the memory cells are erased.

Alternatively, for a block of memory cells connected to a second configuration of local and global word line drivers as shown in FIG. 6, word line-side erase voltages (e.g. Vers=−10V) can be applied to a selected subset of the set of word lines in the selected block to induce tunneling, such as hole tunneling, in memory cells coupled to the selected subset of the set of word lines and coupled to the selected subset of the first string select switches. Word line-side inhibit voltages can be applied to an unselected subset of the set of word lines to inhibit tunneling in memory cells coupled to the unselected subset of the set of word lines and coupled to the unselected subset of the first string select switches.

An order in which the Steps are executed can be different from the order in which the Steps are shown in FIG. 11. For instance, Steps 1130 and 1140 can be executed before Steps 1110 and 1120.

Embodiments of the page erase operations have been described with reference to flash memory. The operations can be tuned for other memory cell types as well, including 2D NAND flash memory, 3D NAND flash memory, NOR flash memory and OTP (one time program) memory.

While the present technology is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the technology and the scope of the following claims.

The invention claimed is:

1. A method of operating a NAND array in a memory that includes a plurality of blocks of memory cells, wherein a block of memory cells in the plurality of blocks comprises a plurality of NAND strings having channel lines between first string select switches and second string select switches, each of the first string select switches in a layer of memory cells in the block connected to a different string select line in a plurality of string select lines, and in which the plurality of NAND strings shares a set of word lines between the first and second string select switches, the memory comprising a set of local word line drivers driving respective word lines in the set of word lines in a selected block, including a first subset of the set of local word line drivers driving a first subset of the set of word lines, and a second subset of the set of local word line drivers driving a second subset of the set of word lines; and a set of global word lines, including first global word lines connected to the first subset of the set of local word line drivers, the method comprising:

applying a bit line voltage to bit lines for providing channel-side voltage to channel lines in a selected block, the bit lines coupled to the channel lines in the selected block through the first string select switches;

applying a control voltage lower than the bit line voltage to a selected subset of string select lines in the plurality of string select lines;

turning off the second string select switches of the plurality of NAND strings; and inhibiting tunneling in memory cells coupled to an unselected subset of the first string select switches.

2. The method of claim 1, wherein said turning off includes:
applying the bit line voltage to a source line coupled to the channel lines through the second string select switches, and to the second string select switches.

3. The method of claim 1, wherein said inhibiting includes:
applying the bit line voltage to the unselected subset of the first string select switches when applying the bit line voltage to the bit lines coupled to the channel lines coupled to the unselected subset of the first string select switches.

4. The method of claim 1, comprising:
applying word line-side erase voltages to the set of word lines in the selected block to induce tunneling in memory cells coupled to the set of word lines and coupled to a selected subset of the first string select switches connected to the selected subset of string select lines.

5. The method of claim 1, comprising:
applying word line-side erase voltages to a selected subset of the set of word lines in the selected block to induce tunneling in memory cells coupled to the selected subset of the set of word lines and coupled to the selected subset of the first string select switches.

6. The method of claim 5, comprising:
logically selecting a number of word lines for the selected subset of the set of word lines.

7. The method of claim 1, comprising:
applying word line-side inhibit voltages to an unselected subset of the set of word lines to inhibit tunneling in memory cells coupled to the unselected subset of the set of word lines and coupled to the unselected subset of the first string select switches.

8. The method of claim 1, comprising:
executing said applying the bit line voltage, said applying the control voltage, said turning off, and said inhibiting, in response to a command to erase memory cells coupled to a selected subset of the first string select switches in the selected block connected to the selected subset of string select lines.

9. A memory, comprising:
a NAND array that includes a plurality of blocks of memory cells, wherein a block of memory cells in the plurality of blocks comprises a plurality of NAND strings having channel lines between first string select switches and second string select switches, each of the first string select switches in a layer of memory cells in the block connected to a different string select line in a plurality of string select lines, and in which the plurality of NAND strings shares a set of word lines between the first and second string select switches;
a set of local word line drivers driving respective word lines in the set of word lines in a selected block, including a first subset of the set of local word line drivers driving a first subset of the set of word lines, and a second subset of the set of local word line drivers driving a second subset of the set of word lines;
a set of global word lines, including first global word lines connected to the first subset of the set of local word line drivers; and
a controller coupled to the memory cells in a selected block, including:
logic to apply a bit line voltage to bit lines for providing channel-side voltage to channel lines in the selected block, the bit lines coupled to the channel lines in the selected block through the first string select switches;
logic to apply a control voltage lower than the bit line voltage to a selected subset of string select lines in the plurality of string select lines;
logic to turn off the second string select switches of the plurality of NAND strings; and
logic to inhibit tunneling in memory cells coupled to a second subset of the first string select switches.

10. The memory of claim 9, the logic to turn off including:
logic to apply the bit line voltage to a source line coupled to the channel lines through the second string select switches, and to the second string select switches.

11. The memory of claim 9, the logic to inhibit including:
logic to apply the bit line voltage to the second subset of the first string select switches when executing the logic to apply the bit line voltage to the bit lines coupled to the second subset of the first string select switches in the selected block.

12. The memory of claim 9, wherein the controller is configured to execute said logic to apply the bit line voltage, said logic to apply the control voltage, said logic to turn off, and said logic to inhibit, in response to a command to erase memory cells coupled to the first subset of the first string select switches in the selected block.

13. A memory, comprising:
a NAND array that includes a plurality of blocks of memory cells, wherein a block of memory cells in the plurality of blocks comprises a plurality of NAND strings having channel lines between first string select switches and second string select switches, and in which the plurality of NAND strings shares a set of word lines between the first and second string select switches;
a set of local word line drivers driving respective word lines in the set of word lines in the selected block, including a first subset of the set of local word line drivers driving a first subset of the set of word lines, and a second subset of the set of local word line drivers driving a second subset of the set of word lines;
a set of global word lines, including first global word lines connected to the first subset of the set of local word line drivers; and
a controller coupled to the memory cells in a selected block, including:
logic to apply a channel-side voltage to the channel lines through the first string select switches in the selected block;
logic to apply a control voltage lower than the channel-side voltage to a first subset of the first string select switches;
logic to float the channel lines at ends of the second string select switches; and
logic to inhibit tunneling in memory cells coupled to a second subset of the first string select switches.

14. The memory of claim 13, wherein the first global word lines are connected to the second subset of the set of local word line drivers, including a global word line driver driving the first global word lines.

15. The memory of claim 13, wherein the set of global word lines includes second global word lines connected to the second subset of the set of local word line drivers, including a first global word line driver driving the first global word lines, and a second global word line driver driving the second global word lines.

16. The memory of claim 13, the controller including:
logic to apply a first global word line voltage on the first global word lines; and logic to turn on the first and second subsets of the set of local word line drivers, providing word line-side erase voltages to the first and second subsets of the set of word lines in the selected block, to induce tunneling in memory cells coupled to the first and second subsets of the set of word lines and coupled to the first subset of the first string select switches.

17. The memory of claim 13, the controller including:
logic to apply a first global word line voltage on the first global word lines; and
logic to turn on the first subset of the set of local word line drivers, providing word line-side erase voltages to the first subset of the set of word lines in the selected block, to induce tunneling in memory cells coupled to the first subset of the set of word lines and coupled to the first subset of the first string select switches.

18. The memory of claim 13, the controller including:
logically selecting a number of word lines for the first subset of the set of word lines.

19. The memory of claim 13, wherein the set of global word lines includes second global word lines connected to the second subset of the set of local word line drivers, the controller including:
logic to apply a second global word line voltage on the second global word lines; and
logic to turn on the second subset of the set of local word line drivers, providing word line-side inhibit voltages to the second subset of the set of word lines to inhibit tunneling in memory cells coupled to the second subset of the set of word lines and coupled to the second subset of the first string select switches.

* * * * *